(12) United States Patent
Deshpande et al.

(10) Patent No.: US 9,343,661 B2
(45) Date of Patent: May 17, 2016

(54) NON-REACTIVE PHOTORESIST REMOVAL AND SPACER LAYER OPTIMIZATION IN A MAGNETORESISTIVE DEVICE

(71) Applicant: Everspin Technologies, Inc., Chandler, AZ (US)

(72) Inventors: Sarin A. Deshpande, Chandler, AZ (US); Kerry Joseph Nagel, Scottsdale, AZ (US); Sanjeev Aggarwal, Scottsdale, AZ (US); Chaitanya Mudivarthi, Chandler, AZ (US)

(73) Assignee: Everspin Technologies, Inc., Chandler, AZ (US)

( * ) Notice: Subject to any disclaimer, the term of this patent is extended or adjusted under 35 U.S.C. 154(b) by 0 days.

(21) Appl. No.: 14/296,189

(22) Filed: Jun. 4, 2014

(65) Prior Publication Data
US 2015/0236249 A1    Aug. 20, 2015

Related U.S. Application Data

(60) Provisional application No. 61/941,250, filed on Feb. 18, 2014.

(51) Int. Cl.
*H01L 43/12* (2006.01)
*H01L 43/08* (2006.01)
*H01L 27/22* (2006.01)

(52) U.S. Cl.
CPC .............. *H01L 43/12* (2013.01); *H01L 27/222* (2013.01); *H01L 43/08* (2013.01)

(58) Field of Classification Search
CPC ...... H01L 43/12; H01L 43/08; G11B 5/3163; G11B 5/3116; G11B 5/127; H01L 27/022; H01F 2027/2809; H01F 17/0013; H01F 2017/0066; H01F 27/327; H01F 41/32

USPC .............................................. 438/3
See application file for complete search history.

(56) References Cited

U.S. PATENT DOCUMENTS

| 5,545,289 A * | 8/1996 | Chen ............. H01L 21/31138 134/1.2 |
| 5,776,821 A | 7/1998 | Haskell et al. |
| 2001/0019036 A1 * | 9/2001 | Kamijima ............ B82Y 10/00 216/22 |
| 2004/0192062 A1 | 9/2004 | Mikelson et al. |
| 2004/0266198 A1 | 12/2004 | Yew |
| 2005/0051820 A1 * | 3/2005 | Stojakovic ............ G11C 11/22 257/295 |
| 2008/0081483 A1 | 4/2008 | Wu |
| 2010/0032642 A1 | 2/2010 | Park et al. |
| 2011/0014500 A1 | 1/2011 | Horng et al. |
| 2014/0217487 A1 | 8/2014 | Guo |

OTHER PUBLICATIONS

PCT Search Report in Application No. PCT/US15/16034 dated Apr. 1, 2015, 11 pages.

* cited by examiner

*Primary Examiner* — Caleen Sullivan

(57) ABSTRACT

In forming a top electrode for a magnetoresistive device, photoresist used in patterning the electrode is stripped using a non-reactive stripping process. Such a non-reactive stripping process uses water vapor or some other non-oxidizing gas that also passivates exposed portions the magnetoresistive device. In such magnetoresistive devices, a non-reactive spacer layer is included that helps prevent diffusion between layers in the magnetoresistive device, where the non-reactive nature of the spacer layer prevents sidewall roughness that can interfere with accurate formation of the lower portions of the magnetoresistive device.

20 Claims, 23 Drawing Sheets

NON-REACTIVE PHOTORESIST REMOVAL AND SPACER LAYER OPTIMIZATION IN A MAGNETORESISTIVE DEVICE

CROSS REFERENCE TO RELATED APPLICATION

This application claims priority to U.S. Provisional Application No. 61/941,250 filed Feb. 18, 2014. The contents of that provisional application are incorporated by reference herein in their entirety.

TECHNICAL FIELD

The disclosure herein relates generally to magnetoresistive devices and more particularly to the use of spacer layers in such devices and methods for manufacturing such devices, including using non-reactive materials to strip photoresist.

BACKGROUND

Resistive memory devices store information by varying the resistance across the memory device such that a read current through a memory cell in the memory device will result in a voltage drop having a magnitude that is based on the information stored in the memory cell. For example, in certain magnetic memory devices, the voltage drop across a magnetic tunnel junction (MTJ) can be varied based on the relative magnetic states of the magnetoresistive layers within the memory cell. In such memory devices, there is typically a portion of the memory cell that has a fixed magnetic state and another portion that has a free magnetic state that is controlled to be either parallel or antiparallel to the fixed magnetic state. Because the resistance through the memory cell changes based on whether the free portion is parallel or antiparallel to the fixed portion, information can be stored by setting the orientation of the free portion. The information is later retrieved by sensing the orientation of the free portion. Such magnetic memory devices are well known in the art.

Writing magnetic memory cells can be accomplished by sending a spin-polarized write current through the memory device where the angular momentum carried by the spin-polarized current can change the magnetic state of the free portion. One of ordinary skill in the art understands that such a current can either be directly driven through the memory cell or can be the result of applying one or more voltages where the applied voltages result in the desired current. Depending on the direction of the current through the memory cell, the resulting magnetization of the free portion will either be parallel or antiparallel to the fixed portion. If the parallel orientation represents a logic "0", the antiparallel orientation may represent a logic "1", or vice versa. Thus, the direction of write current flow through the memory cell determines whether the memory cell is written to a first state or a second state. Such memory devices are often referred to as spin torque transfer memory devices. In such memories, the magnitude of the write current is typically greater than the magnitude of a read current used to sense the information stored in the memory cells.

Manufacturing magnetoresistive devices, including MTJ devices, includes a sequence of processing steps during which many layers of materials are deposited and then patterned to form a magnetoresistive stack and the electrodes used to provide electrical connections to the magnetoresistive stack. The magnetoresistive stack includes the various layers that make up the free and fixed portions of the device as well as one or more dielectric layers that provide at least one the tunnel junction for the MTJ device. In many instances, the layers of material are very thin, on the order of a few or tens of angstroms. Similarly, the dimensions of such layers after patterning and etching are extremely small, and small deviations or imperfections during processing can have a significant impact on device performance.

Because an MRAM device may include millions of MTJ elements, precise processing steps used in manufacturing the devices can contribute to increased densities by allowing devices to be placed in close proximity without unwanted interaction. Therefore, it is desirable to provide techniques for manufacturing such devices that ensure proper operation while supporting increased densities.

DETAILED DESCRIPTION

Figure 1:
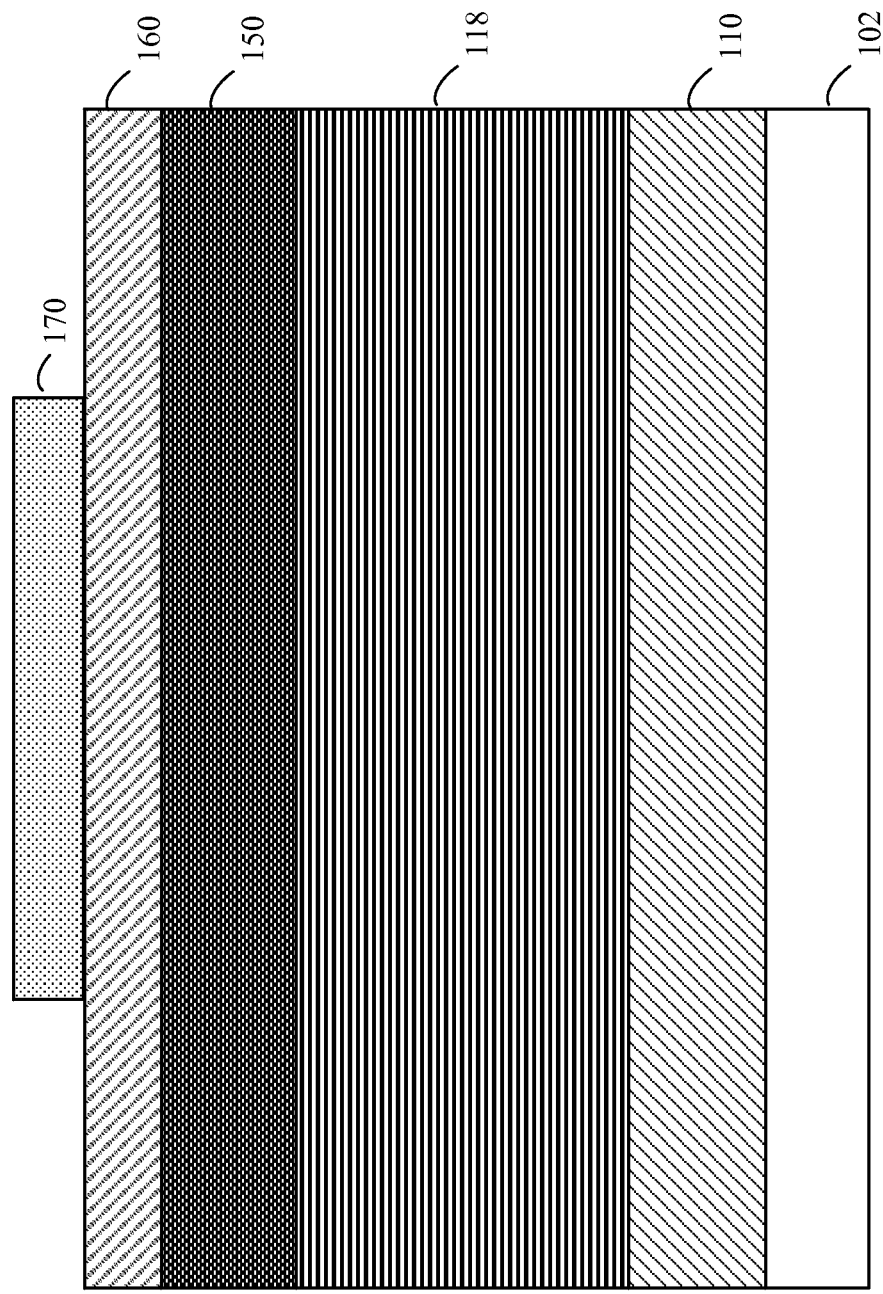
FIGS. 1-3 and 5-8 illustrate cross-sectional views of layers included in a magnetoresistive device during different stages of manufacturing in accordance with an exemplary embodiment.

The following detailed description is merely illustrative in nature and is not intended to limit the embodiments of the subject matter or the application and uses of such embodiments. Any implementation described herein as exemplary is not necessarily to be construed as preferred or advantageous over other implementations.

For simplicity and clarity of illustration, the figures depict the general structure and/or manner of construction of the various embodiments. Descriptions and details of well-known features and techniques may be omitted to avoid unnecessarily obscuring other features. Elements in the figures are not necessarily drawn to scale: the dimensions of some features may be exaggerated relative to other elements to improve understanding of the example embodiments. For example, one of ordinary skill in the art appreciates that the cross-sectional views are not drawn to scale and should not be viewed as representing proportional relationships between different layers. The cross-sectional views are provided to help illustrate the processing steps performed by simplifying the various layers to show their relative positioning. Moreover, while certain layers and features are illustrated with straight 90-degree edges, in actuality or practice such layers may be more "rounded" or gradually sloping.

The terms "comprise," "include," "have" and any variations thereof are used synonymously to denote non-exclusive inclusion. The term "exemplary" is used in the sense of "example," rather than "ideal."

During the course of this description, like numbers may be used to identify like elements according to the different figures that illustrate the various exemplary embodiments.

For the sake of brevity, conventional techniques related to semiconductor processing may not be described in detail herein. The exemplary embodiments described herein may be fabricated using known lithographic processes as follows. The fabrication of integrated circuits, microelectronic devices, micro electro mechanical devices, microfluidic devices, and photonic devices involves the creation of several layers of materials that interact in some fashion. One or more of these layers may be patterned so various regions of the layer have different electrical or other characteristics, which may be interconnected within the layer or to other layers to create electrical components and circuits. These regions may be created by selectively introducing or removing various materials. The patterns that define such regions are often created by lithographic processes. For example, a layer of photoresist is applied onto a layer overlying a wafer substrate. A photo mask (containing clear and opaque areas) is used to selectively expose the photoresist by a form of radiation, such as ultraviolet light, electrons, or x-rays. Either the photoresist exposed to the radiation, or that not exposed to the radiation, is removed by the application of a developer. An etch may then be applied to the underlying layer not protected by the remaining resist such that the layer overlying the substrate is patterned. Alternatively, an additive process can be used in which a structure is built up using the photoresist as a template.

There are many inventions described and illustrated herein, as well as many aspects and embodiments of those inventions. In one aspect, the described embodiments relate to, among other things, methods of manufacturing a magnetoresistive-based device having one or more electrically conductive electrodes or conductors on either side of a magnetic material stack. As described in further detail below, the magnetic material stack may include many different layers of material, where some of the layers include magnetic materials, whereas others do not. In one embodiment, the methods of manufacturing include forming the layers for the magnetoresistive device and then masking and etching those layers to produce a magnetic tunnel junction (MTJ) device. Examples of MTJ devices include transducers such as electromagnetic sensors as well as memory cells.

Magnetoresistive devices are typically formed to include a top electrode and a bottom electrode that permit access to the device by allowing for connectivity to other circuit elements. Formation of these electrodes during the processing operations used in manufacturing the devices can be optimized in order to provide sharp definition of the electrodes thereby both aiding in defining and producing other layers included in the magnetoresistive device structure as well as providing known dimensions for the magnetoresistive device structure, thereby enabling such devices to be placed in close proximity to each other. By enabling the devices to be placed in close proximity to each other, device densities in applications such as MRAMs can be increased. One technique described in more detail below uses a two-step etching process to define the top electrode within the device. The two-step etching process uses a combination of isotropic and more anisotropic etching, where the different levels of isotropy can be achieved by varying the power applied during plasma etching as well as varying the pressure applied during such plasma etching.

Another technique described herein provides for non-reactive stripping of the photoresist used to pattern the top electrode. For example, the photoresist may be stripped using water vapor or some other non-oxidizing gas, where such non-reactive stripping may also provide passivation with respect to other layers included in the magnetoresistive device structure. By using a non-reactive stripping process, oxidation of exposed material, such as the sidewalls of the top electrode, is avoided. Avoiding oxidation of those sidewalls helps retain more precise physical definition of the magnetoresistive device, thereby ensuring proper operation within tight specifications.

Another technique that helps further more precise magnetoresistive device physical definition, and thereby promote higher densities with less operational deviation between devices, is to optimize the material used for a spacer layer included within the magnetoresistive device structure. As discussed in more detail below, a spacer layer can help prevent diffusion between different layers within the magnetoresistive device. When the spacer layer comprises material that can oxidize, subsequent etching steps following definition of the spacer layer can result in sidewalls of the spacer layer oxidizing, thereby causing sidewall roughness or bulging that negatively impacts the physical definition of the underlying MTJ layers. Thus, embodiments are contemplated in which the material used for the spacer layer is non-reactive such that it does not oxidize or react with etch chemistries used in defining the layers below the spacer layer in the magnetoresistive device. In other embodiments, the spacer layer is omitted entirely, thereby ensuring that undesirable sidewall roughness due to spacer layer oxidation does not occur.

FIG. 1 illustrates a cross-sectional view of a partially formed magnetoresistive device disposed on a substrate 102. The cross-sectional view shows a plurality of layers, where each of the layers is formed, deposited, grown, sputtered, or otherwise provided. The layers may be deposited using any technique now known or later developed. The simplified cross-sectional view presented in FIG. 1 includes electrically conductive layer 110, a plurality of layers 118 making up the magnetoresistive stack corresponding to the magnetoresistive device, electrically conductive layer 150, hard mask layer 160, and patterned photoresist layer 170. The patterned photoresist layer 170 may be deposited and patterned using any technique now known or later developed, for example, well known conventional deposition and lithographic techniques.

The electrically conductive layers 110 and 150 provide the material used to define the top and bottom electrodes for the magnetoresistive device. The plurality of layers 118 within the magnetoresistive stack may include a number of different layers of both magnetic and nonmagnetic material. For example, the plurality of layers 118 may include multiple layers of magnetic material, dielectric layers that provide one or more tunnel barriers or diffusion barriers, coupling layers between layers of magnetic material that provide for ferromagnetic or antiferromagnetic coupling, anti-ferromagnetic material, and other layers utilized in magnetoresistive stacks as currently known or later developed. For example, the plurality of layers 118 may include a first set of layers forming a synthetic anti-ferromagnetic structure (SAF), a dielectric layer forming a tunnel barrier, another set of layers forming a synthetic ferromagnetic structure (SYF), another dielectric layer forming a diffusion barrier, and one or more layers forming a spacer layer. Notably, each of the layers included in the magnetoresistive device may be a composite layer that includes multiple sub-layers. Other embodiments may include multiple SAFs, SYFs, and tunnel barriers in addition to the other layers, where the materials and structures are arranged in various combinations and permutations now known or later developed.

One technique described herein focuses on a two-step etching process used to define the top electrode from the electrically conductive layer 150. Because the top electrode overlies the stack for the magnetoresistive device, the benefits of the two-step etching process would be applicable to various magnetoresistive devices having different stack compositions.

Figure 2:
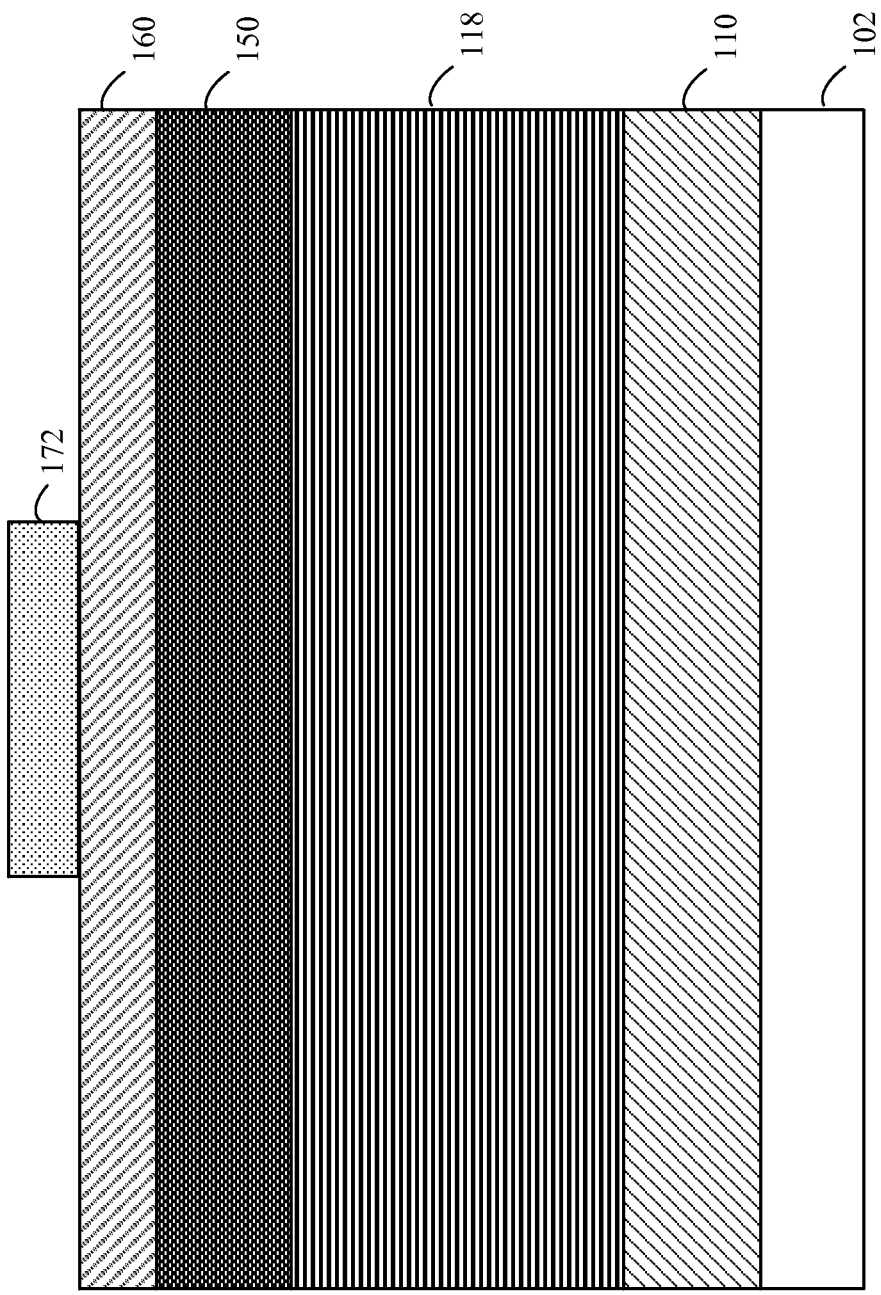

In FIG. 2, the cross-sectional view of FIG. 1 is updated to reflect the trimming of the patterned layer of photoresist 170 to produce trimmed photoresist 172. After initially patterning the photoresist to produce the patterned photoresist layer 170, it may be advantageous to "trim" the photoresist and thereby adjust or shrink the size of at least a portion of the magnetoresistive device that is defined at least in part by the photoresist. The trimming process may also provide pattern fidelity that can result in more uniform edges for the device structure. The photoresist 120 may be trimmed using any technique now known or later developed, for example, well known conventional trimming techniques.

Figure 3:
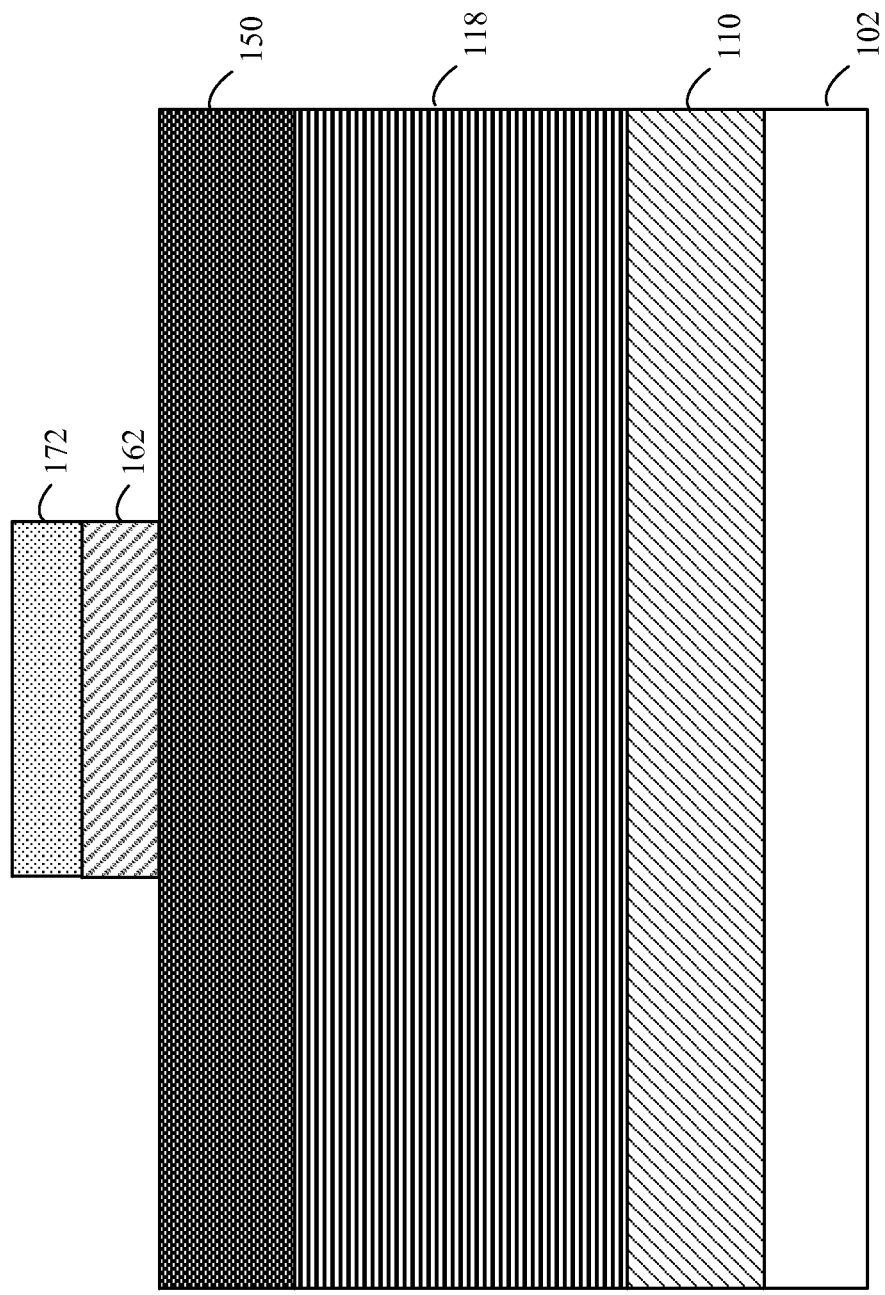

FIG. 3 shows the cross-sectional view following etching of the hard mask layer 160 to produce a hard mask 162. As used herein, "hard" when used with "hard mask" means the ability to resist a particular etch. The hard mask layer 160 may be etched via chemical etching to form or provide the hard mask 162. Examples of such chemical etch processes including those using gases such as $CF_4$, $CHF_3$, $CH_2F_2$ and carrier gases such as Ar and Xe. Notably, the hard mask layer 160 may be etched, formed and/or patterned using any etchants and techniques now known or later developed—for example, using conventional etchants and techniques.

Figure 4:
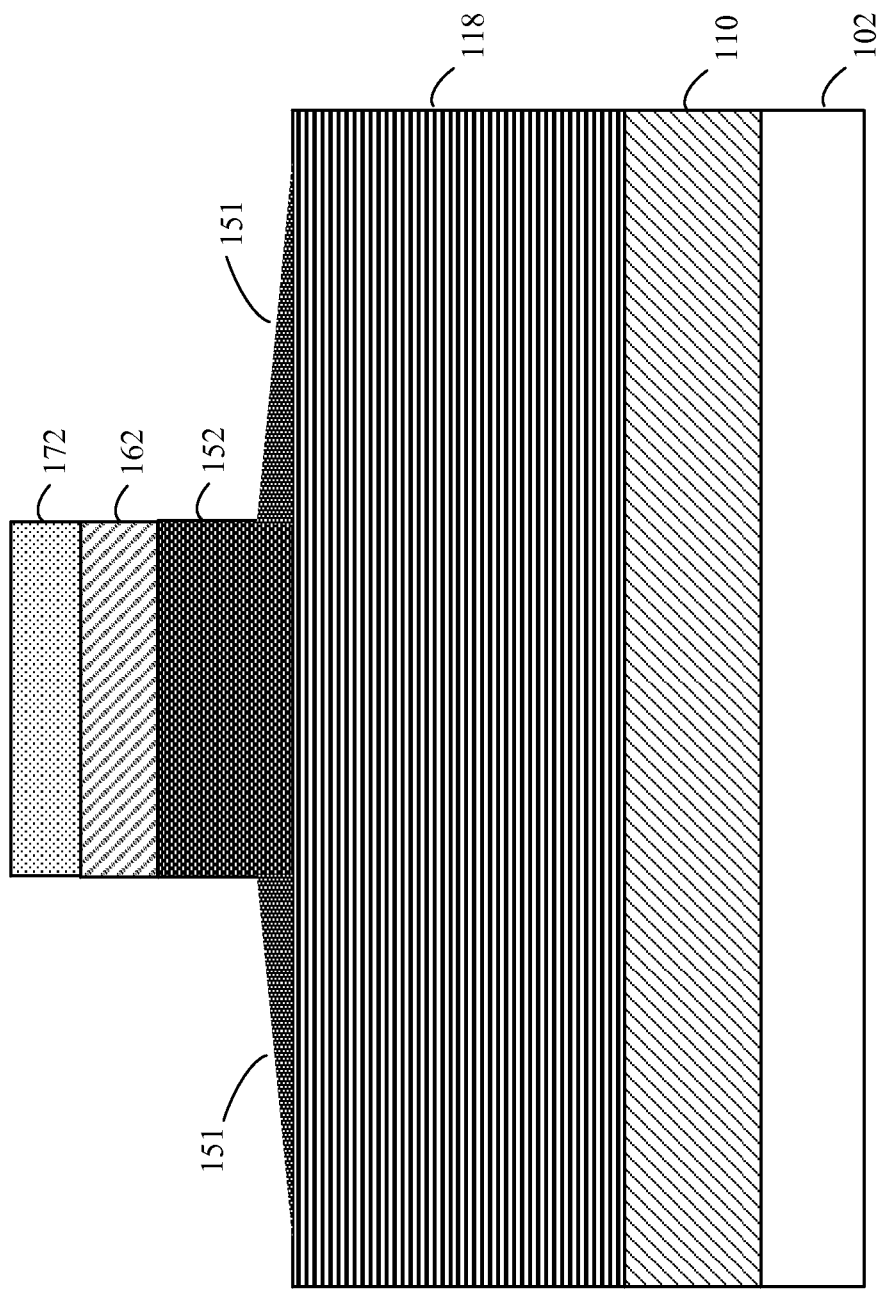
FIG. 4 illustrates a cross-sectional view of layers included in a magnetoresistive device during definition of a top electrode manufactured using a single step etching process.

FIG. 4 shows the cross-sectional view from FIG. 3 following a one-step etch using a constant bias power. Bias power refers to a voltage applied to a chuck upon which the wafer sits in the etching chamber, where the voltage applied directs the plasma in the etching chamber. For example, a higher power (greater voltage) may cause the plasma to be attracted to the chuck, thereby causing the etching operation to become more anisotropic as the plasma is directed in a more downward direction. During etching of the top electrode, it may be desirable to also realize a benefit in shrinking the footprint of the trimmed photoresist 172. Thus, while the photolithography equipment initially used a pattern the photoresist layer 170 may have certain limitations, subsequent trimming can reduce the minimum feature size of that photolithography equipment, and isotropic etching may be used to further trim the photoresist 172. Isotropic etching results in material removal in a non-direction-specific format. Thus, the top surface of the trimmed photoresist 172 will be etched along with the sidewalls of the top electrode 152. In contrast to isotropic etching, anisotropic etching has directional dependence. Thus, if a more anisotropic etch is applied, such as one that is directed vertically from top to bottom, more material will be removed from the top of the trimmed photoresist 172 than will be removed from the sidewalls.

As depicted in FIG. 4, using a one-step etch with constant isotropy for the formation of the top electrode can result in non-uniform etching of the electrically conductive layer 150 to produce etched electrically conductive portion 152 which includes undesirable residual portions 151. The undesirable residual portions 151 may negatively impact subsequent etching steps directed at the layers underlying the electrically conductive layer 150. Thus, a two-step etch with different isotropy for each step helps in eliminating the undesirable residual portions 151. The isotropic step of the two step etch provides the necessary "trim" while the anisotropic part removes residual portions 151.

In order to avoid the potential issues illustrated and described with respect to FIG. 4, the etching of the top electrode can be split into two separate steps. The two steps may be referred to as the main etch and the over etch. By separating the etching into two steps, and providing for different levels of isotropy within those two steps, the desired effects of isotropic etching can be realized along with the desired effects of more anisotropic etching. In one embodiment, the main etch is an isotropic etch, whereas the over etch is more anisotropic in order to provide the sharp features desirable for the top electrode as it may be used as a reference for subsequent etching steps and overall device definition. In another embodiment, the main etch may be more anisotropic, thereby providing an initial sharp feature definition, and the over etch may be isotropic, thereby providing the benefits associated with a non-direction-specific etch.

The electrically conductive layer 150 from which the top electrode is formed may include one or more layers of electrically conductive material such as, for example, Ta, TaN or Ta—TaN composite. In one embodiment, a Ta, TaN or Ta—TaN composite electrically conductive layer 150 may be of a thickness of about 50-1000 Angstroms. The etchants and techniques used to etch those materials in the two-step etching process may be any etchants or techniques now known or later developed. Examples include chemical etch processes with gases such as $Cl_2$, $CF_4$, $CHF_3$, $CH_2F_2$ and carrier gases such as Ar, $N_2$ and Xe. Different gases may be used during the main etch and the over etch to achieve the desired result. For example, a $Cl_2$-based chemistry may be used for the main etch and a $F_2$-based etch chemistry may be used for the over etch.

In order to control the level of isotropy associated with the particular etch process, the power applied to the chuck on which the semiconductor wafer sits during etching can be varied in order to increase or decrease the vertical flow of etching material within the etching chamber. For example, applying higher power to the chuck can result in plasma within the chamber being attracted towards the chuck, thereby causing it to impact the material on the wafer in a more directional, vertical fashion. Applying lower power would reduce such directional flow, thereby increasing the isotropy of the etching process. In addition to varying the power for the etch, the pressure applied within the chamber during the etch can also impact the level of isotropy. Lower pressure within the chamber allows the etching material to move more freely, thereby allowing increased power to have a greater impact on the directional flow of the etching material. Greater pressure produces greater isotropy as the pressure causes the particles of etching material to be forced against the material being etched more evenly from all directions. The isotropy of the etch may be controlled using any tool technique now known or later developed. In other embodiments, rather than using the same etching material with different power or pressure settings, the two-step etch process can be accomplished by using two separate etching materials, where one etching material is more anisotropic than the other.

Figure 5:
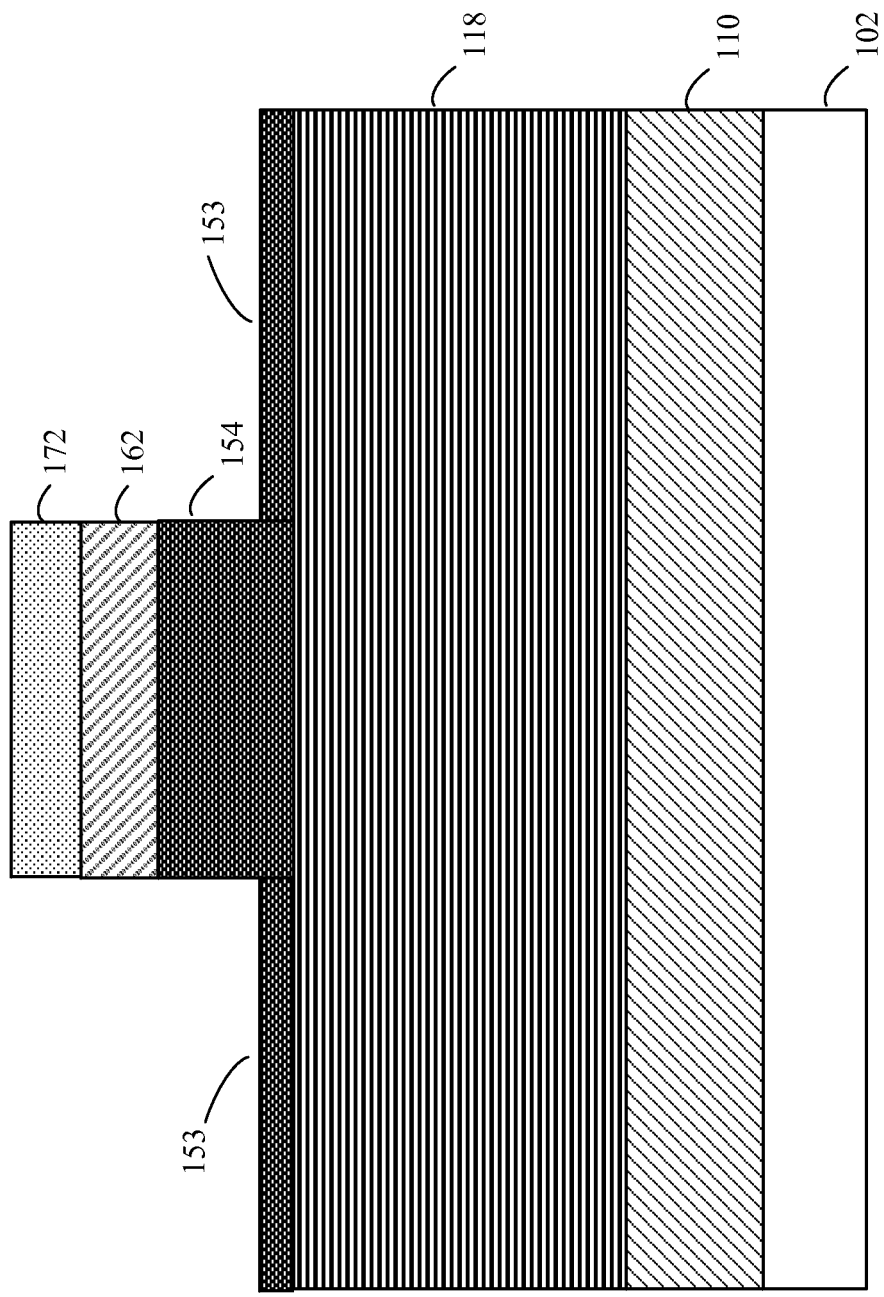

FIG. 5 illustrates a cross-sectional view corresponding to FIG. 3 after an initial main etch has been performed. Thus, rather than having a single step etch process for defining the top electrode such as that discussed with respect to FIG. 4, FIG. 5 illustrates the cross-sectional view following the first step of a two-step etching process used to define the top electrode. In the example embodiment illustrated, the initial main at may be an isotropic etch, thereby further reducing the feature size of the patterned photoresist 172. Thus, while not illustrated in FIG. 5, the width and the height of patterned photoresist 172 may shrink during the initial main etch due to the isotropic nature of the main etch. The initial main etch may be a low-power etch that moves more slowly through the material within the electrically conductive layer 150. Following the main etch, the remaining portion of the electrically conductive layer 154 still includes portions 153 that need to be removed in order to fully define the top electrode. Determining when to stop the main etch may be based on a preset time or based on detection of an endpoint wavelength using optical emission spectroscopy. Optical emission spectroscopy can be used to detect when the spectrum corresponding to material of the electrically conductive layer begins to fall, thereby indicating that the main etch has almost reached the bottom of the layer of electrically conductive material.

While the main etch may provide the isotropic etching desired to further reduce the feature size of the patterned magnetoresistive device, the over etch may be more anisotropic in nature in order to provide a straighter profile for the magnetoresistive device and to help clear away residual material left over from previous processing steps. Thus, the main etch may be use a lower power bias and be primarily isotropic, whereas during the over etch, the power bias is raised to make the etching more anisotropic. For example, the main etch may be completely isotropic, whereas the over etch is 80% isotropic and 20% anisotropic. In a specific example using an Applied Materials 200 mm DPS chamber, the main etch may utilize about 50-60 W of power for the bias, whereas the over etch increases the power by about 50 percent.

Figure 6:
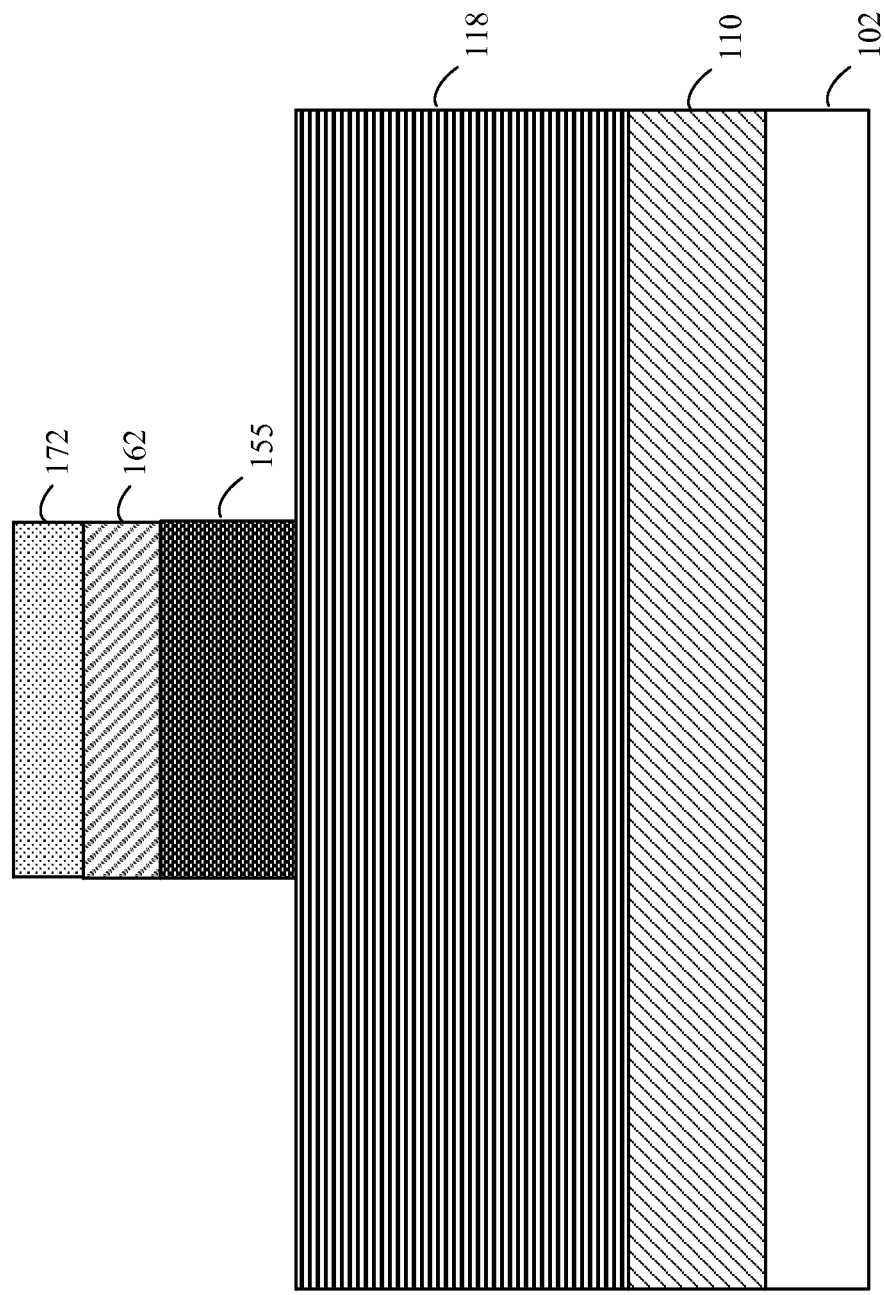

FIG. 6 illustrates a cross-sectional view following the over etch. As shown, the over etch removes the remaining portions 153 of the electrically conductive layer 150 that are not a part of the top electrode 155. Thus, the top electrode 155 depicted in FIG. 6 has been produced using the two-step etch such that the sharper sidewalls are achieved by more anisotropic etching, while still achieving the benefits associated with an isotropic main etch. In an embodiment where the magnetoresistive device is a memory cell included in a memory device, the anisotropic etching decreases variations in certain parameters for the large number of memory cells included in the memory device. Being able to provide sharp well-defined device structures reduces variations in parameters such as resistance, switching field, and switching voltages associated with the memory cells making up the memory device.

As shown in FIG. 6, the over etch stops prior to reaching the plurality of layers 118 that are subsequently processed to form the magnetoresistive device stack. In some embodiments, the top layers of the plurality of layers 118 may benefit from the etching characteristics of the over etch used to finalize the top electrode, and in such cases, the over etch may continue into one or more of the layers included in the plurality of layers 118. However, in other cases, the higher power over etch may be incompatible with the layers included in the plurality of layers 118, and, in such cases, the over etch is stopped before it reaches those layers. For example, while the over etch may be a reactive etch, a spacer layer at or near the top of the plurality of layers 118 may require a non-reactive etch. As is the case with the over etch and other etching steps discussed herein, determining when the junction between the layers has been reached and that it is time to stop etching may be based on an elapsed period of time or based on detection of an endpoint wavelength using optical omission spectroscopy.

Following definition of the top electrode 155, the patterned photoresist 172 depicted in FIG. 6 may be stripped prior to further processing of the magnetoresistive device structure. In one embodiment, the photoresist is stripped using water vapor or a different non-reactive gas. Stripping the photoresist can help to avoid problems that occur during subsequent etching steps in which the photoresist would break down and result in undesirable residual material. For example, a subsequent etch using a mixture of Ar and $O_2$ gases may be adversely affected if the photoresist is not stripped away before performing that etch.

Figure 7:
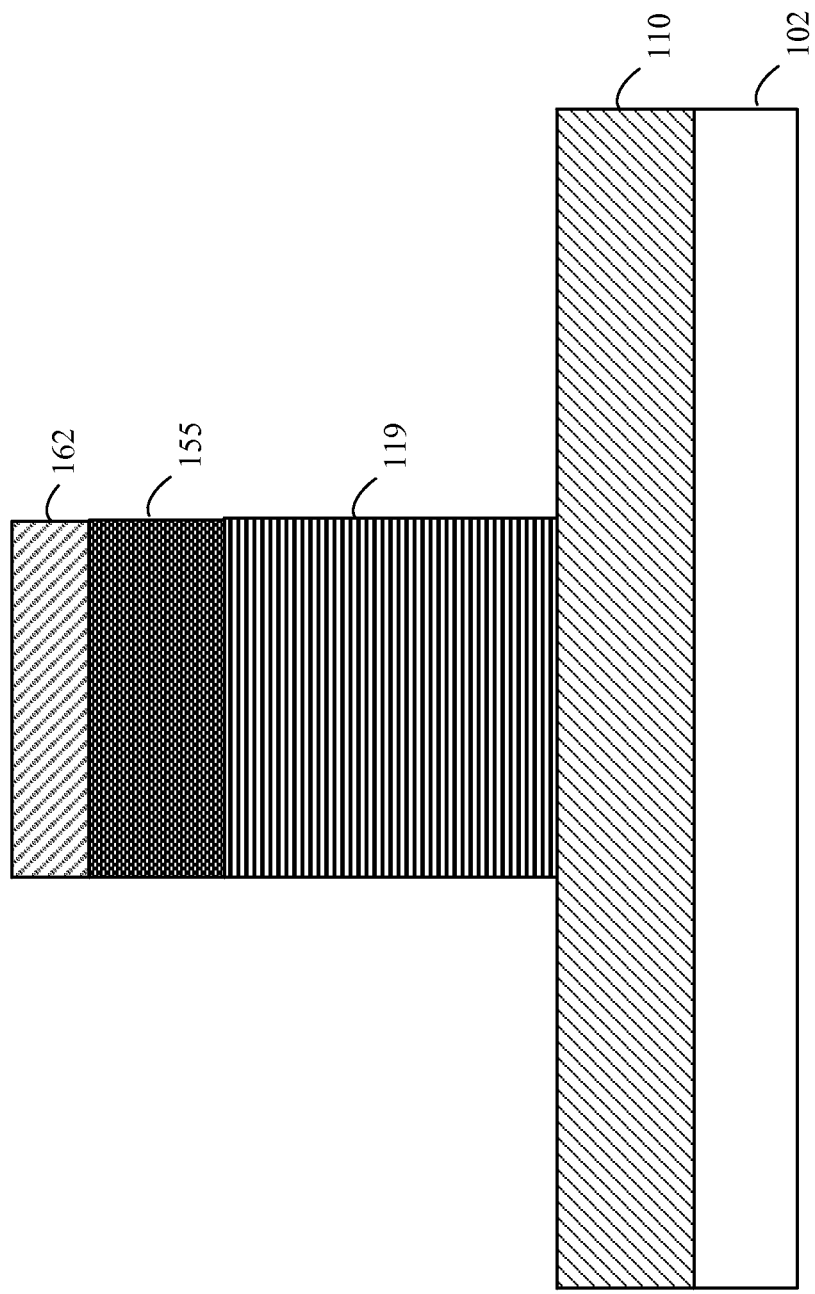

FIG. 7 depicts the cross-sectional view following further definition of the plurality of layers 118 to produce the magnetoresistive device stack 119. Such definition may be accomplished by one or more etching steps. Device stack 119 includes a plurality of layers that interact to form the magnetoresistive device, which, for example, may be a MTJ device. As discussed immediately above, in one embodiment, the photoresist is stripped prior to such etching, whereas in other embodiments, the photoresist may be stripped at some point during the etching of the various layers included within the plurality of layers 118.

Figure 8:
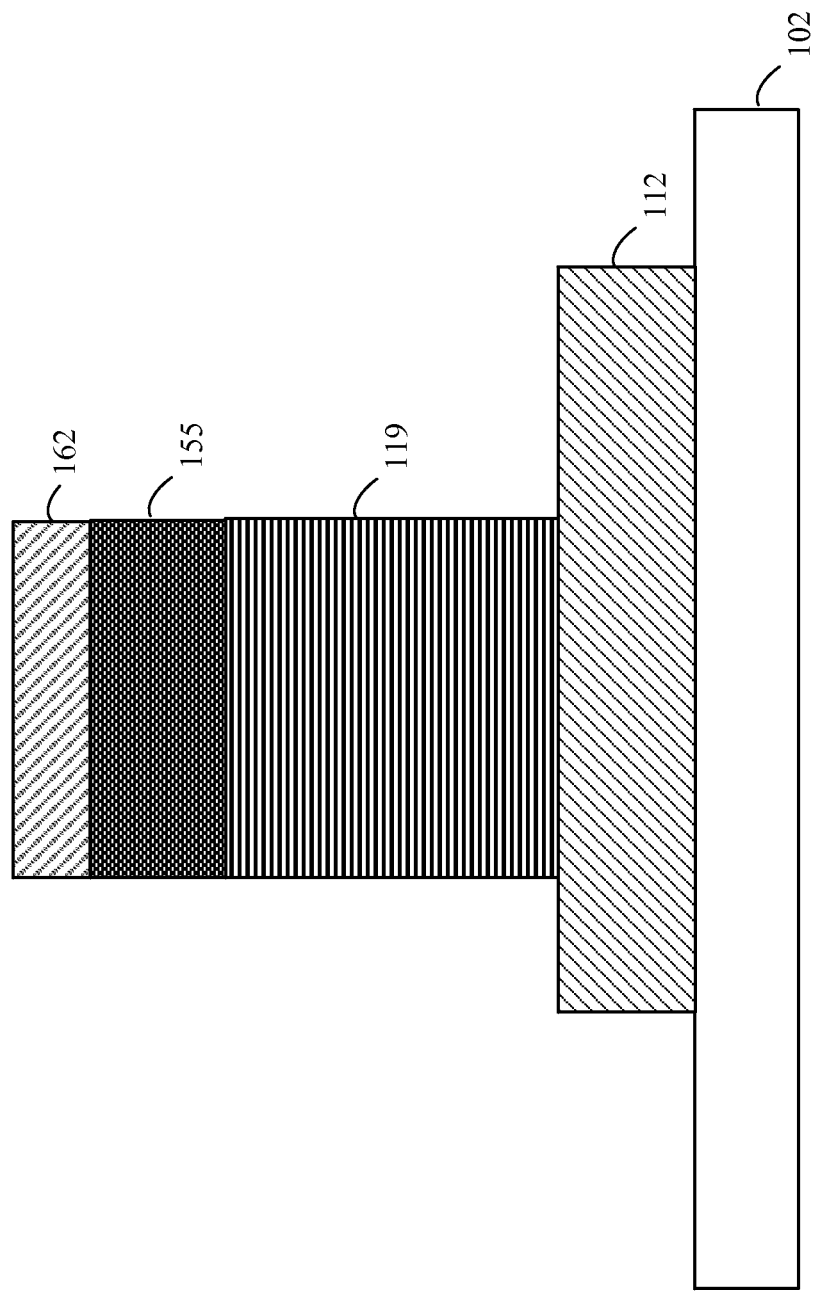

Following the definition of the magnetoresistive device stack 119, the electrically conductive layer 110 is etched in order to form bottom electrode 112, which is depicted in FIG. 8. The bottom electrode 112 allows for an electrical connection to the bottom of the magnetoresistive device.

Notably, while described as appropriate for a magnetoresistive device, the two-step etching technique described herein may also be useful in other devices in which the combination of isotropic and anisotropic etching to define an electrode provides benefit. For example, devices other than magnetoresistive devices may benefit from producing such a top electrode by first performing a main etch having a first level of etching isotropy and then performing an over etch having a second level of etching isotropy, where the first level of etching isotropy and the second level of etching isotropy are different.

Figure 9:
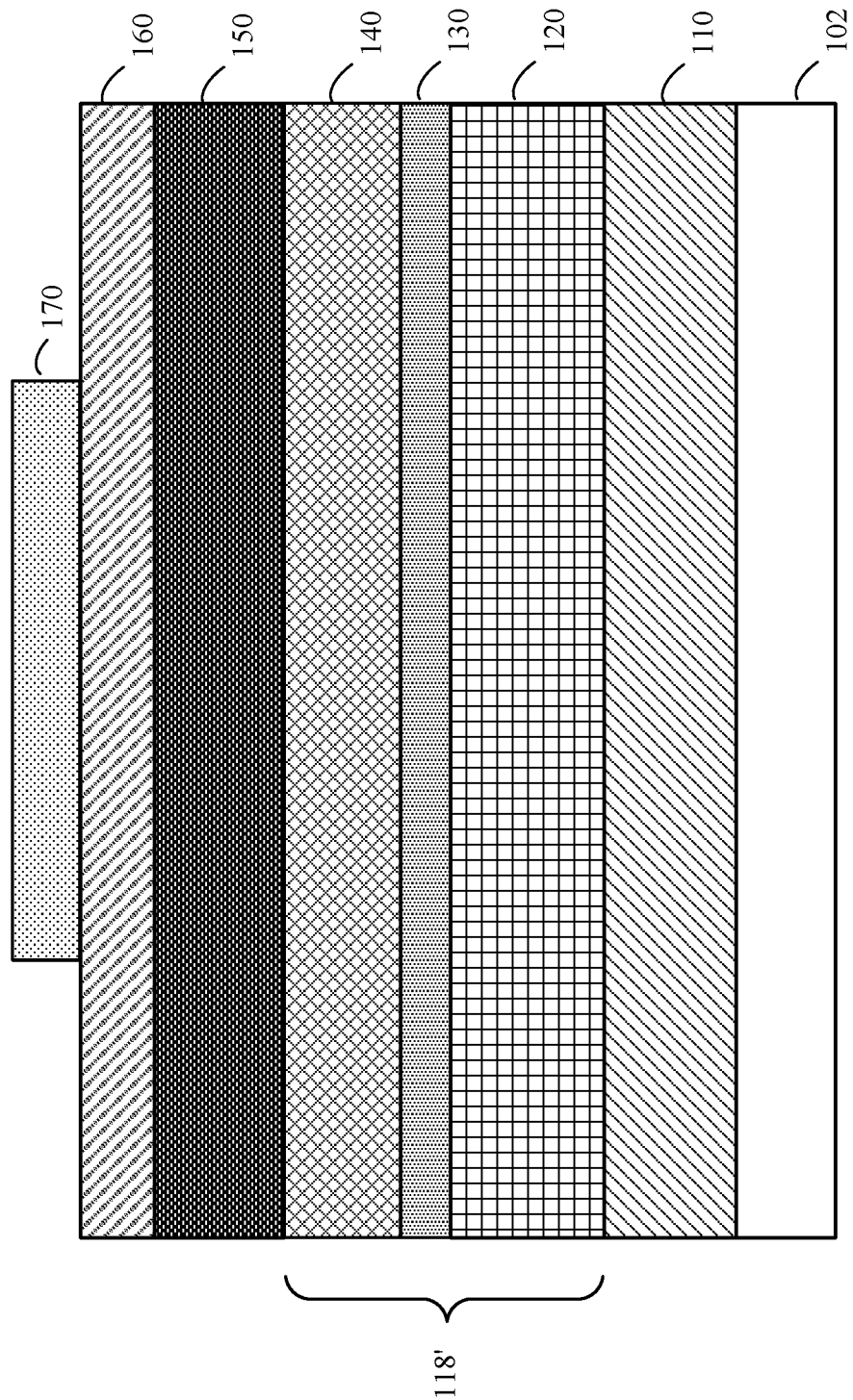
FIG. 9 illustrates a cross-sectional view of a set of layers included in a magnetoresistive device in accordance in accordance with an exemplary embodiment.
Figure 10:
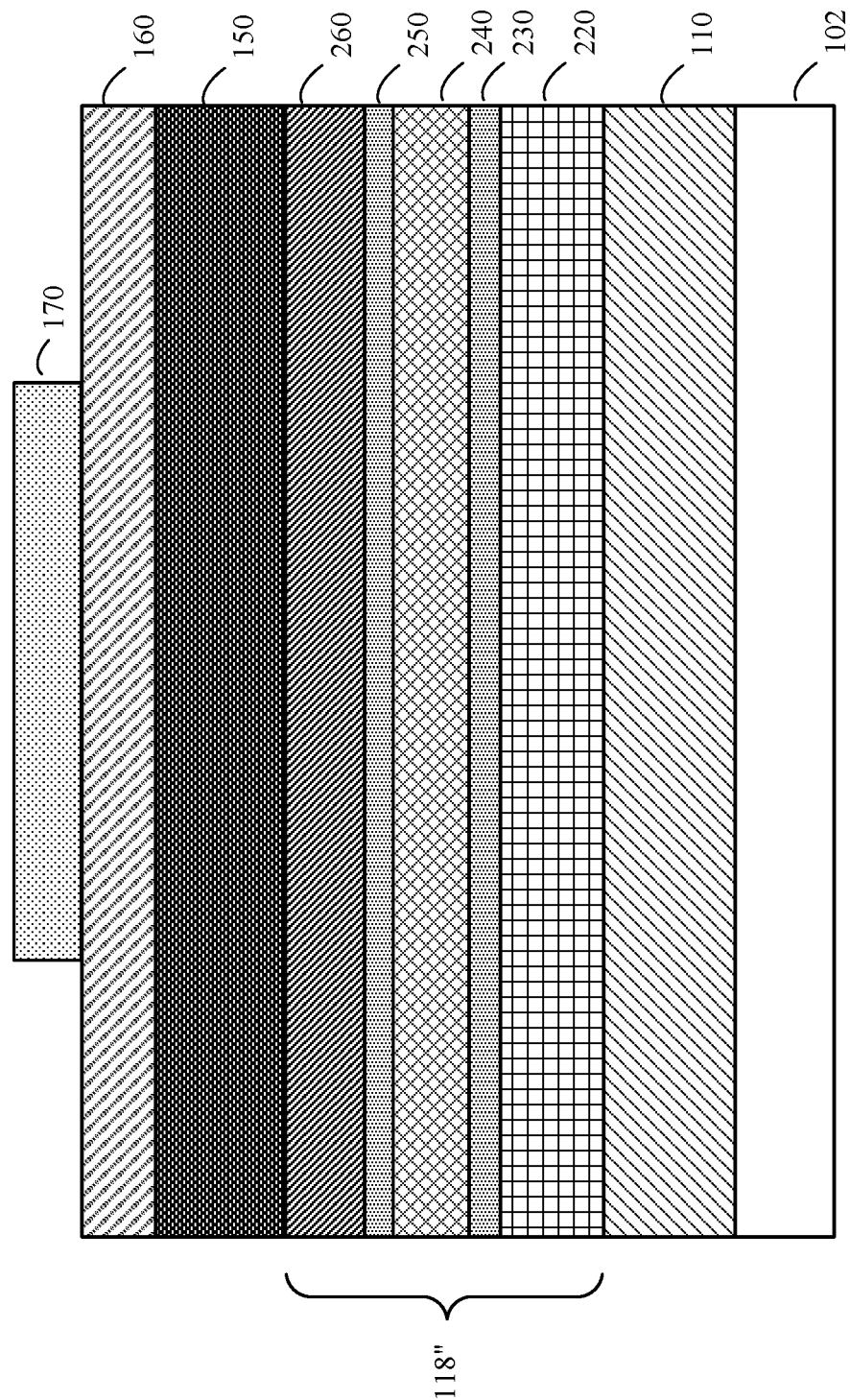
FIG. 10 illustrates a cross-sectional view of a set of layers included in a magnetoresistive device in accordance in accordance with another exemplary embodiment.

FIGS. 9 and 10 provide cross-sectional views of the layers making up magnetoresistive devices in specific embodiments in which the plurality of layers 118 depicted in FIG. 1 are further detailed. As discussed above with respect to FIG. 1, the layers shown in FIGS. 9 and 10 are described in a general fashion, and may include multiple sub-layers as well as composite layers. Thus, while FIGS. 9 and 10 include additional detail in order to provide further context for the embodiments discussed herein, they should not be viewed as limiting and rather as specific examples to aid in illustration.

In the example shown in FIG. 9, the plurality of layers 118' used to produce the magnetoresistive device stack 119 includes a lower layer of magnetic material 120, a dielectric layer 130, and an upper layer of magnetic material 140. In one embodiment, the dielectric layer 130 serves as a tunnel barrier, which, in conjunction with magnetic material layers 120 and 140, establishes an MTJ structure. As noted above, each of these layers may include multiple sub-layers. For example, lower layer of magnetic material 120 may include anti-ferromagnetic material as well as other magnetic material layers arranged in a SAF structure, whereas the upper layer of magnetic material 140 may include multiple sub-layers that form a SYF structure.

FIG. 10 illustrates an alternate embodiment in which the plurality of layers 118" used to produce the magnetoresistive device stack 119 includes a different configuration of layers. The plurality of layers 118" included in FIG. 10 includes a lower layer of magnetic material 220, a first dielectric layer 230, which may serve as a tunnel barrier, a second upper layer of magnetic material 240, a second dielectric layer 250, which may serve as a diffusion barrier, and a spacer layer 260.

As was the case with the embodiments discussed above, each of these layers may include a plurality of sub-layers as well as composite layers.

FIGS. 11-14 are flow charts that illustrate exemplary embodiments of a method of manufacturing a magnetoresistive device, where, in one example, the magnetoresistive device is a spin-torque MTJ device included in an MRAM. The operations included in the flow charts may represent only a portion of the overall process used to manufacture the device. For example, FIGS. 11-12 focus on forming the top electrode for the device from a set of already-formed layers using a two-step etch process. The various tasks performed in connection with the methods of FIGS. 11-14 may be performed by software, hardware, firmware, or any combination thereof. For illustrative purposes, the following description of the methods in FIGS. 11-14 may refer to elements mentioned above in connection with FIGS. 1-10. In practice, portions of methods may be performed by different elements of the described system, e.g., a processor, a display element, or a data communication component. It should be appreciated that methods may include any number of additional or alternative tasks, the tasks shown in FIGS. 11-14 need not be performed in the illustrated order, and the methods may be incorporated into a more comprehensive procedure or process having additional functionality not described in detail herein. Moreover, one or more of the tasks shown in FIGS. 11-14 could be omitted from an embodiment as long as the intended overall functionality remains intact.

Figure 11:
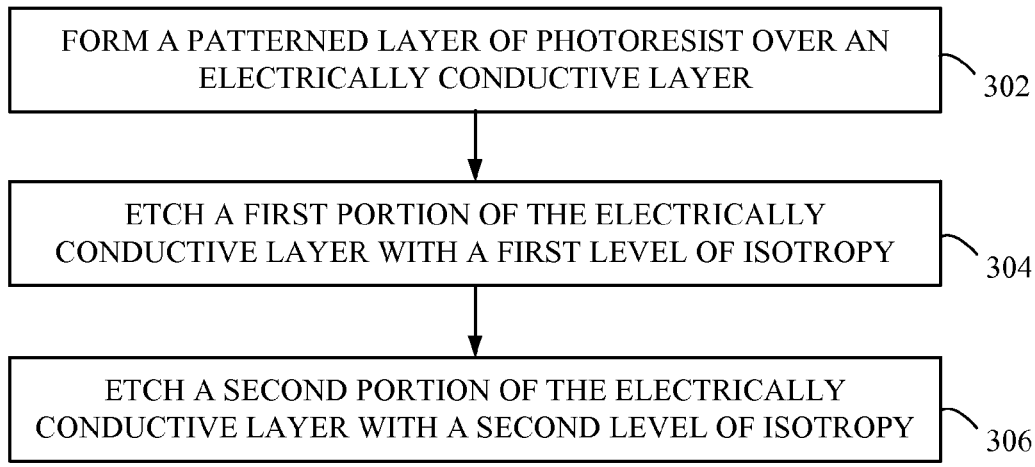
FIGS. 11-14 are flow charts of methods of manufacturing a magnetoresistive device in accordance with exemplary embodiments.

In FIG. 11 the layers corresponding to the magnetoresistive device to be formed have already been deposited on an underlying substrate. At 302 a patterned layer of photoresist is formed over and electrically conductive layer, where the electrically conductive layer provides the material used to form the top electrode for the magnetoresistive device. At 304, a first portion of the electrically conductive layer that is not covered by the patterned layer of photoresist is etched. The etching performed at 304 utilizes an etching process that has a first level of etching isotropy. At 306, a second portion of the electrically conductive layer that is not covered by the patterned layer of photoresist is etched, where the second portion is etched using an etching process that has a second level of etching isotropy that is different from the first level of etching isotropy used during the etching of the first portion at 304.

Thus, the etching operations corresponding to the top electrode are split into two separate etching steps that utilize differing levels of isotropy. In one embodiment, the first etching step is an isotropic etch during which further trimming of the photoresist occurs, whereas the second etching step is more anisotropic, thereby helping to clear away residual matter as well as providing sharp definition for the magnetoresistive device structure. In another embodiment, the first etching operation may be an anisotropic etching operation such that the sharp definition is achieved, whereas the second etching step is isotropic.

When etching that is more anisotropic is desired, a greater bias power may be applied during the etching operation whereas a lesser bias power is applied during the isotropic etching. For example, the etching of the first portion at 304 may be accomplished using the same etching chemistries as that used during the etching of the second portion at 306, where a different amount of power is applied during the respective etching operations. If the etching of the first portion at 304 is isotropic and the etching of the second portion at 306 is more anisotropic, a greater by a greater bias power may be applied during the etching of the second portion 306. As discussed above, applying greater bias power may include applying the power to a chuck underlying the wafer during a plasma etching operation, where greater power to the chuck results in more directional flow of the plasma, thereby producing a more anisotropic etching operation.

While varying the power provides one means for adjusting the anisotropic nature of the etching operation, varying the pressure within the etching chamber can also impact the isotropic/anisotropic nature of the etching. For example, applying a lesser amount of pressure during the etching of the second portion at 306 may increase the anisotropic nature of the etching by enabling the plasma to be more easily directed. Similarly, raising the pressure during the first etching operation at 304 may cause the etching to be more isotropic as the plasma is forced to interact with the material being etched from all sides and not in a directional manner.

Figure 12:
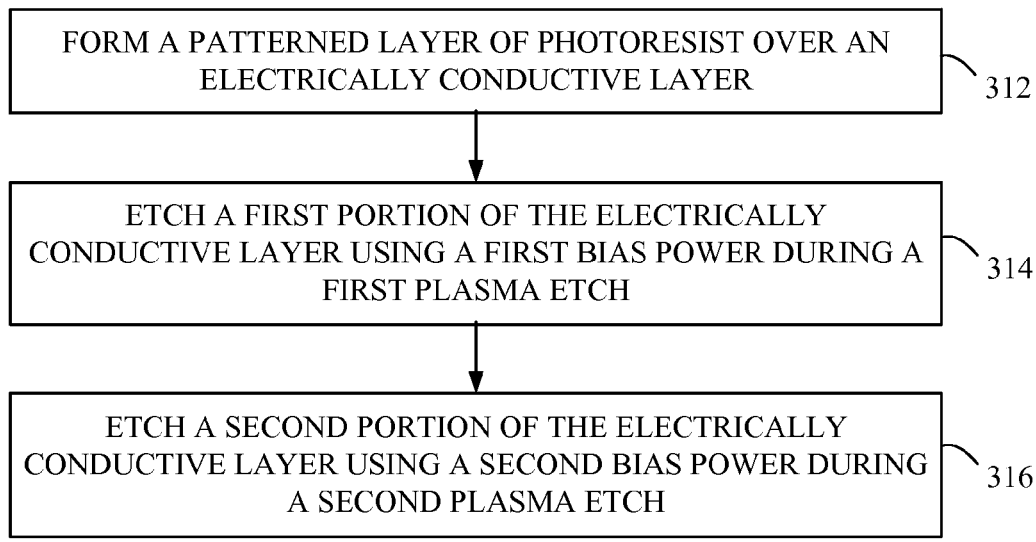

As was the case with FIG. 11, in FIG. 12 the various layers included and the magnetoresistive device have already been formed prior to the operations illustrated. At 312, a patterned layer of photoresist is formed over the electrically conductive layer, where the electrically conductive layer provides the material from which the top electrode is to be formed. At 314 first portion of the electrically conductive layer is etched using a first bias power during a first plasma etch. As discussed above, the first bias power can be controlled in order to cause the etching at 314 to be more or less anisotropic. At 316, a second portion of the electrically conductive layer is etched using a second bias power during a second plasma etch. Thus, differing bias powers are used during the etching at 314 and 316 in order to achieve different levels of isotropy during the two-step etching process used to produce the top electrode. Notably, the first and second etching operations at 314 and 316 may rely on the same etching chemistry, and, in one embodiment, the only difference between the two etching steps is the amount of power applied to the chuck. Moreover, while the etching is described as being separated into two distinct steps, in other embodiments, the etching may be accomplished using a more gradual transition between levels of isotropy. For example, rather than an abrupt shift in power from a lower level to a higher level, the power may be gradually ramped up from an initial level to a greater level, thereby gradually increasing the anisotropic nature of the etch. Similar gradual shifts in other parameters, including chemistry and pressure, may also be used to change the level of isotropy used while forming the top electrode.

Figure 13:
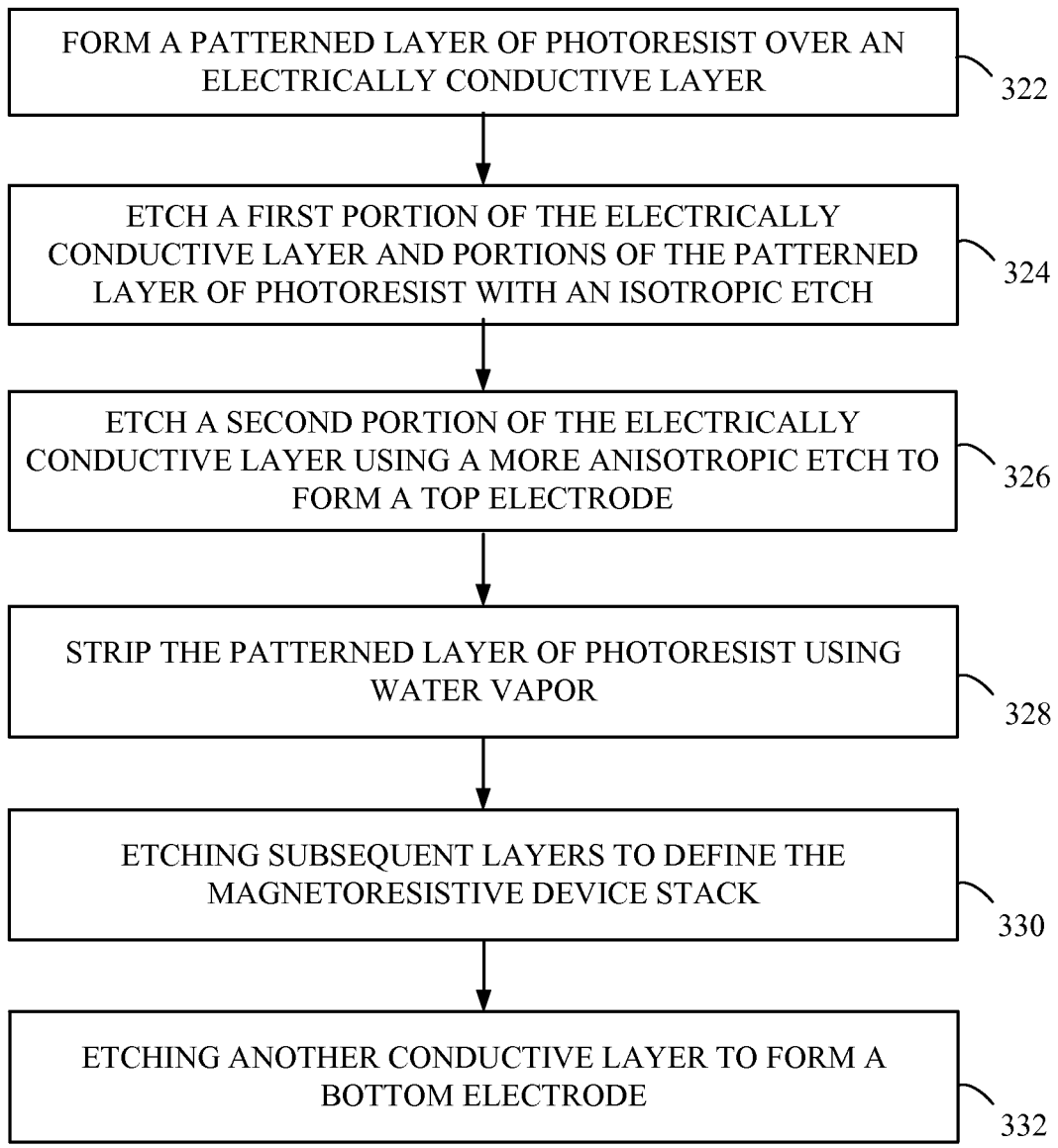

In FIG. 13, a patterned layer of photoresist is formed over a layer of electrically conductive material at 322, where the electrically conductive material is to be processed to form the top electrode for the magnetoresistive device. At 324 a first portion of the electrically conductive layer and portions of the patterned layer of layer of photoresist are etched using an isotropic etch. Thus, the isotropic nature of the etch at 324 not only removes portions of the electrically conductive layer, but also helps to further trim the photoresist in order to allow for smaller magnetoresistive devices that may not be achievable with conventional lithography and trimming techniques. As discussed above, the isotropic nature of the etch at 324 may be achieved based on a low bias power and higher pressure within the etching chamber. A determination as to when to stop the etching performed at 324 may be based on the amount of time or the detection of an endpoint wavelength associated with the optical omission spectrum for the etching operation.

At 326 a second portion of the electrically conductive layer is etched using a more anisotropic etch. A determination as to when to stop the etching performed at 326 may be based on the amount of time or the detection of an endpoint wavelength associated with the optical omission spectrum for the etching operation. As discussed above, the more anisotropic etch at 326 may be achieved by raising the power applied and decreasing the pressure within the etching chamber. In one embodiment, the etching chemistry used in etching each of the first and second portions at 324 and 326 is substantially similar. Thus, rather than varying the etching chemistry, the conditions present when the etching occurs can be manipulated in order to vary the isotropy of the etching. In other embodiments, a different etching chemistry may be employed during the first and second etching portions 324 and 326 in order to vary the level of isotropy. As a result of the etching performed at 324 and 326, the top electrode is formed. Thus, formation of the top electrode has been split into at least two separate etching operations, where the first is an isotropic etch and the second is an anisotropic etch that helps to clear residual matter as well as provide sharp definition for the magnetoresistive device structure.

At 328 the patterned layer of photoresist is stripped using water vapor. Because the water vapor is non-reactive, the sidewalls of the top electrode that have been exposed do not oxidize or degrade in some other manner. At 330, subsequent layers below the top electrode are etched to define the magnetoresistive device stack. As discussed above, etching the subsequent layers includes at least etching one or more layers of magnetic material and one or more dielectric layers that are not covered by the top electrode to form the magnetic material stack. The top electrode formed at 324 and 326 serves as a top electrical contact for the magnetic material stack. As shown above with respect FIG. 10, the layers underlying the top electrode may also include a spacer layer. Thus, the etching performed at 330 may include etching the portion of the spacer layer that is not covered by the top electrode. In some embodiments, the spacer layer may be formed of a reactive material such that it is helpful to stop the etching of the top electrode prior to reaching the material from which the spacer layer is formed.

At 332, a layer of electrically conductive material under the magnetoresistive device stack is etched to form the bottom electrode for the magnetoresistive device. Thus, the stack structure is sandwiched between the top and bottom electrodes, which allow the device to be connected to other circuitry for operation.

Figure 14:
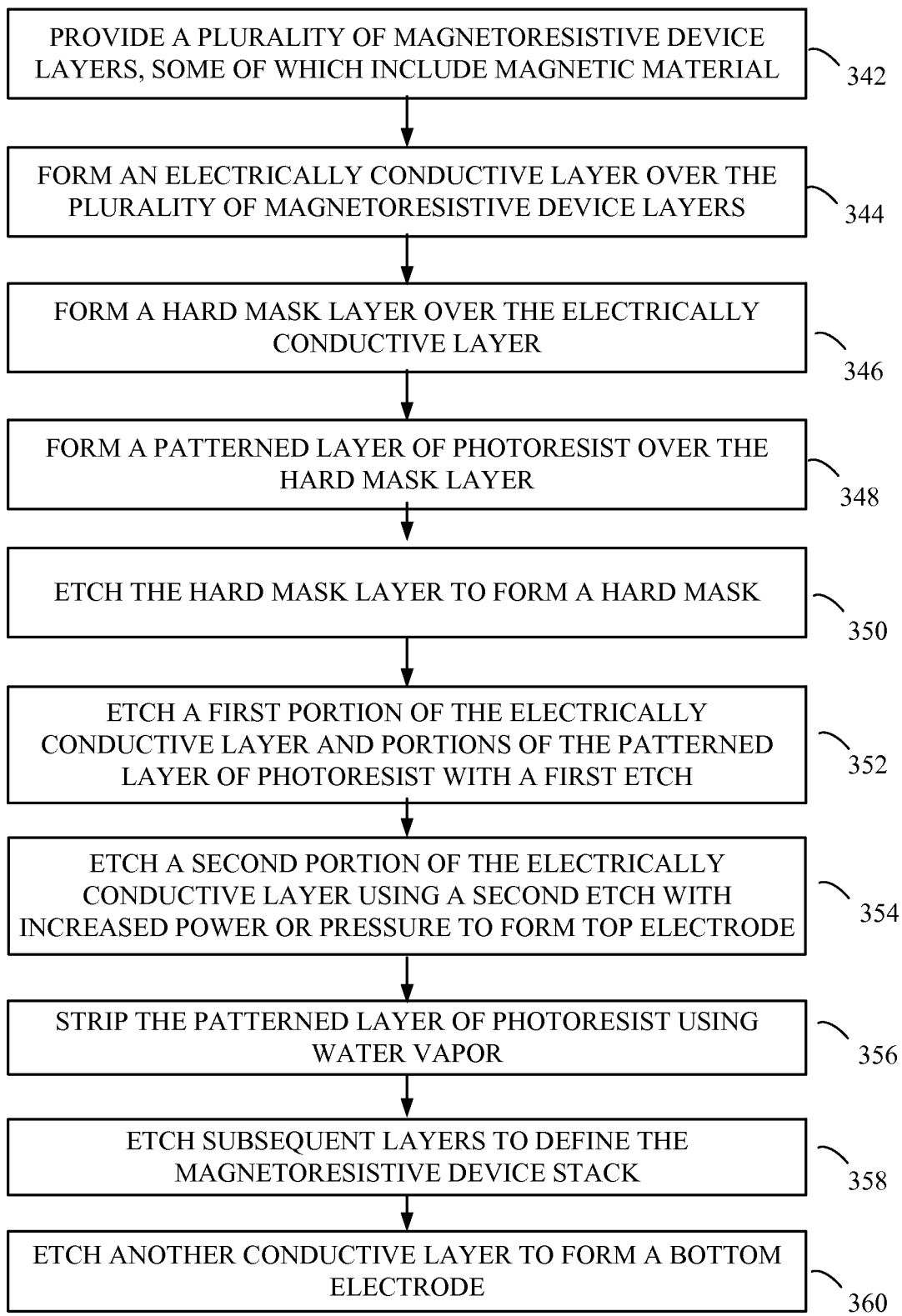

In FIG. 14 a plurality of magnetoresistive device layers are provided at 342. The plurality of magnetoresistive device layers includes some layers of magnetic material as well as the other various material layers discussed above as being included in the magnetoresistive device stack. At 344 an electrically conductive layer is formed over the plurality of magnetoresistive device layers. At 346 a hard mask is formed over the electrically conductive layer. At 348 a patterned layer photoresist is formed over the hard mask layer. At 350, the hard mask layer is etched to form a hard mask.

At 352 and 354 a two-step etching operation is employed to define the top electrode for the magnetoresistive device. At 352 a first portion of the electrically conductive layer and portions of the patterned layer of photoresist are etched using a first etch. At 354 a second portion of the electrically conductive layer is etched using a second etch that employs increased power or pressure in order to increase the anisotropic nature of the etch.

At 356 the patterned layer photoresist is stripped using water vapor, and at 358 the subsequent layers below the top electrode are etched in order to define the magnetoresistive device stack. At 360 another conductive layer underlying the magnetoresistive device stack is etched in order to form the bottom electrode for the magnetoresistive device, thereby providing a top and bottom electrode with which external circuitry can access the magnetoresistive device.

FIGS. 15-21 provide cross-sectional views of the various layers making up a magnetoresistive device and illustrate the stages of device formation during which the various layers are etched. The layers included in the magnetoresistive device illustrated in FIGS. 15-21 correspond to those discussed earlier with respect to FIG. 10. Notably, the layers included in the magnetoresistive device illustrated in FIGS. 15-21 include a spacer layer 260 under the electrically conductive layer 150 used to form the top electrode.

Figure 15:
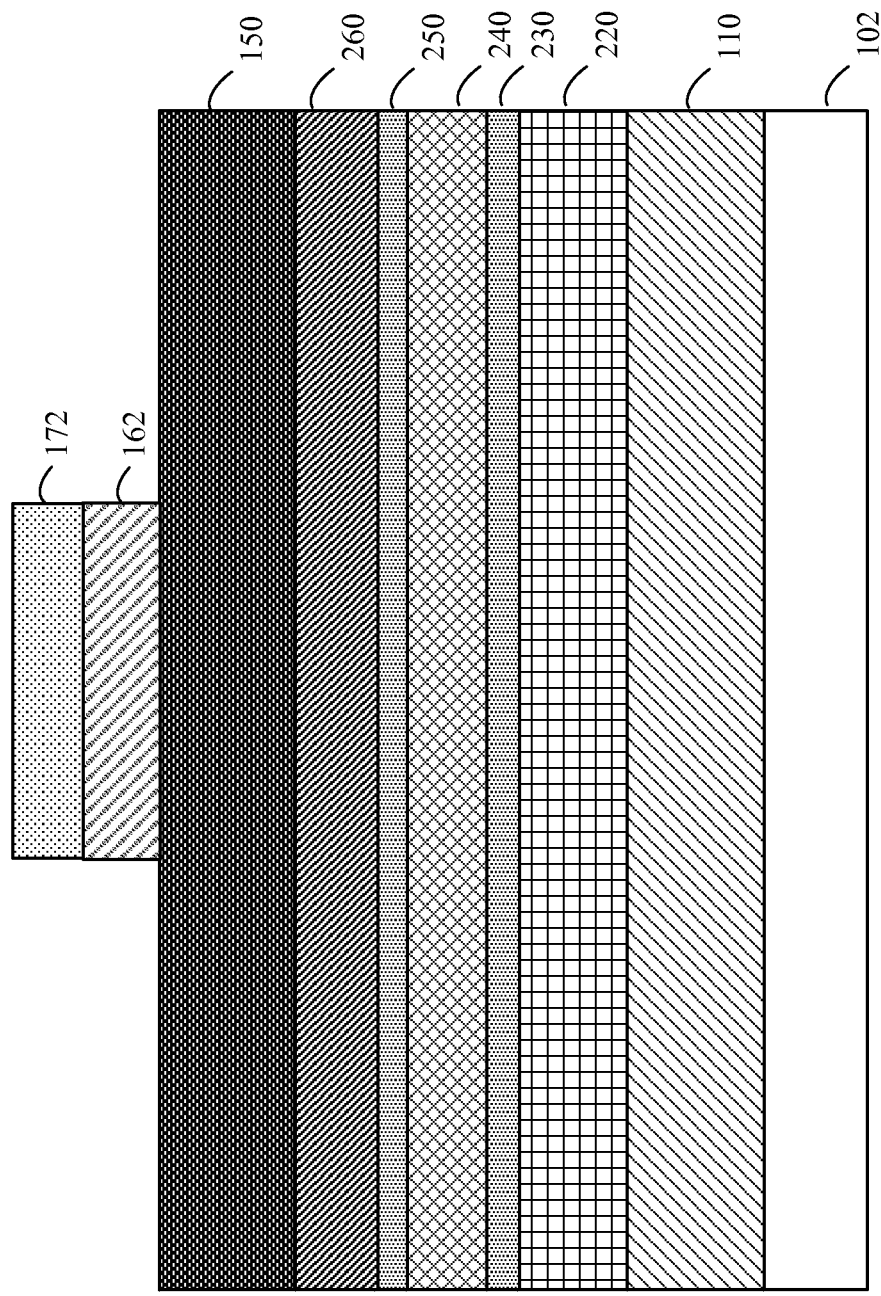
FIGS. 15-21 illustrate cross-sectional views of layers included in a magnetoresistive device during different stages of manufacturing in accordance with another exemplary embodiment.

As shown in FIG. 15, the layers included in the device are deposited on a substrate 102. A lower electrically conductive layer 110 is formed over the substrate 102, a lower layer of magnetic material 220 is formed over the electrically conductive layer 110, a lower dielectric layer 240 is formed over the lower layer of magnetic material 220, an upper layer of magnetic material 240 is formed over the lower dielectric layer 230, an upper dielectric layer 250 is formed over the upper layer of magnetic material 240, a spacer layer 260 is formed over the upper dielectric layer 250, the electrically conductive layer 150 is formed over the spacer layer 260, a hard mask layer 160 is formed over the electrically conductive layer 150 and etched to form hard mask 162, and patterned photoresist 170 is formed over the hard mask layer 160 and trimmed to form trimmed photoresist 172. As shown in FIG. 15, after the patterned layer of photoresist has been formed and trimmed, the hard mask layer not covered by the patterned layer of photoresist is etched to form hard mask 162.

Figure 16:
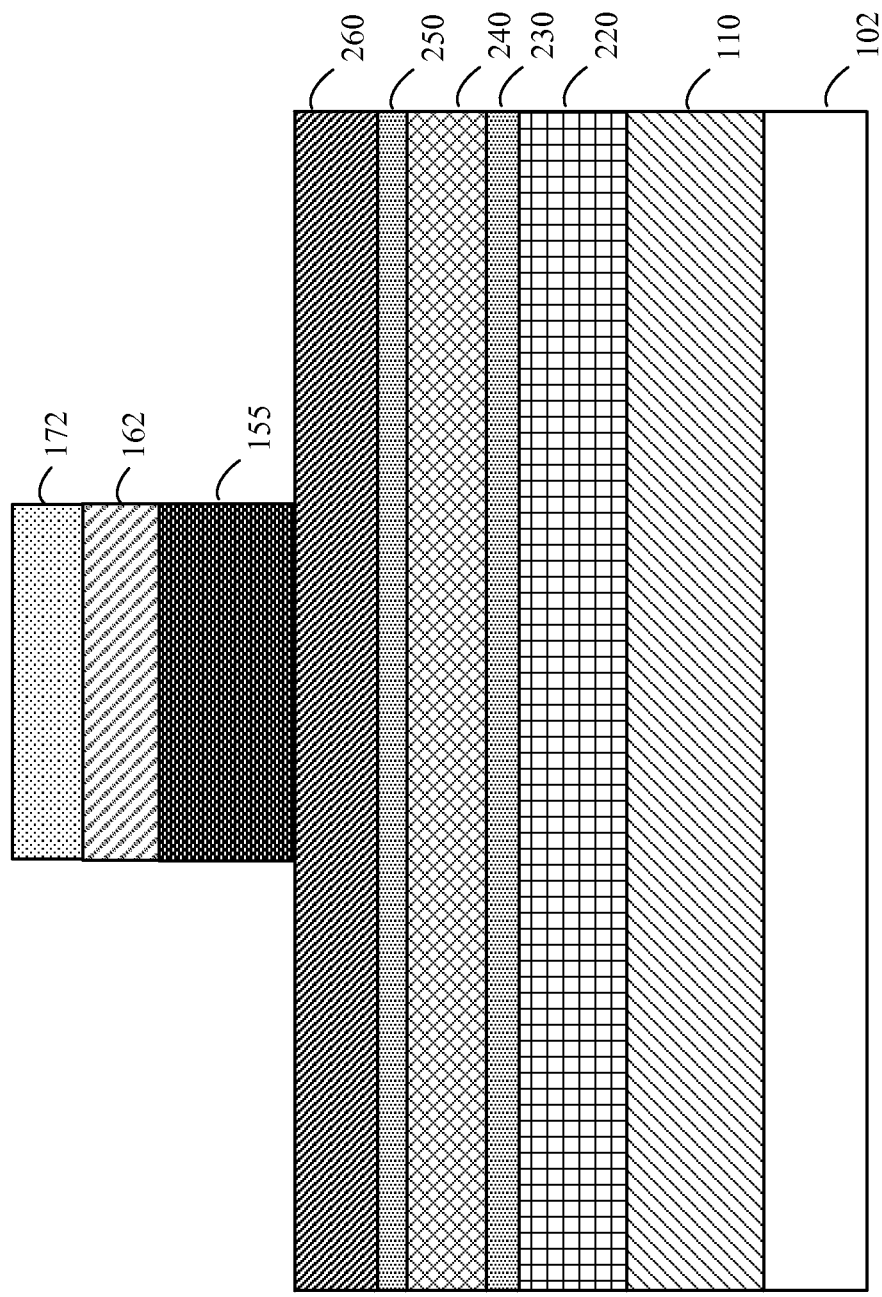

In FIG. 16, the top layer of electrically conductive material 150 has been etched to form top electrode 155. The etching performed in order to realize top electrode 155 may include the two-step etch process discussed above, other known techniques for etching to form a top electrode, as well as techniques later developed for top electrode formation.

Figure 17:
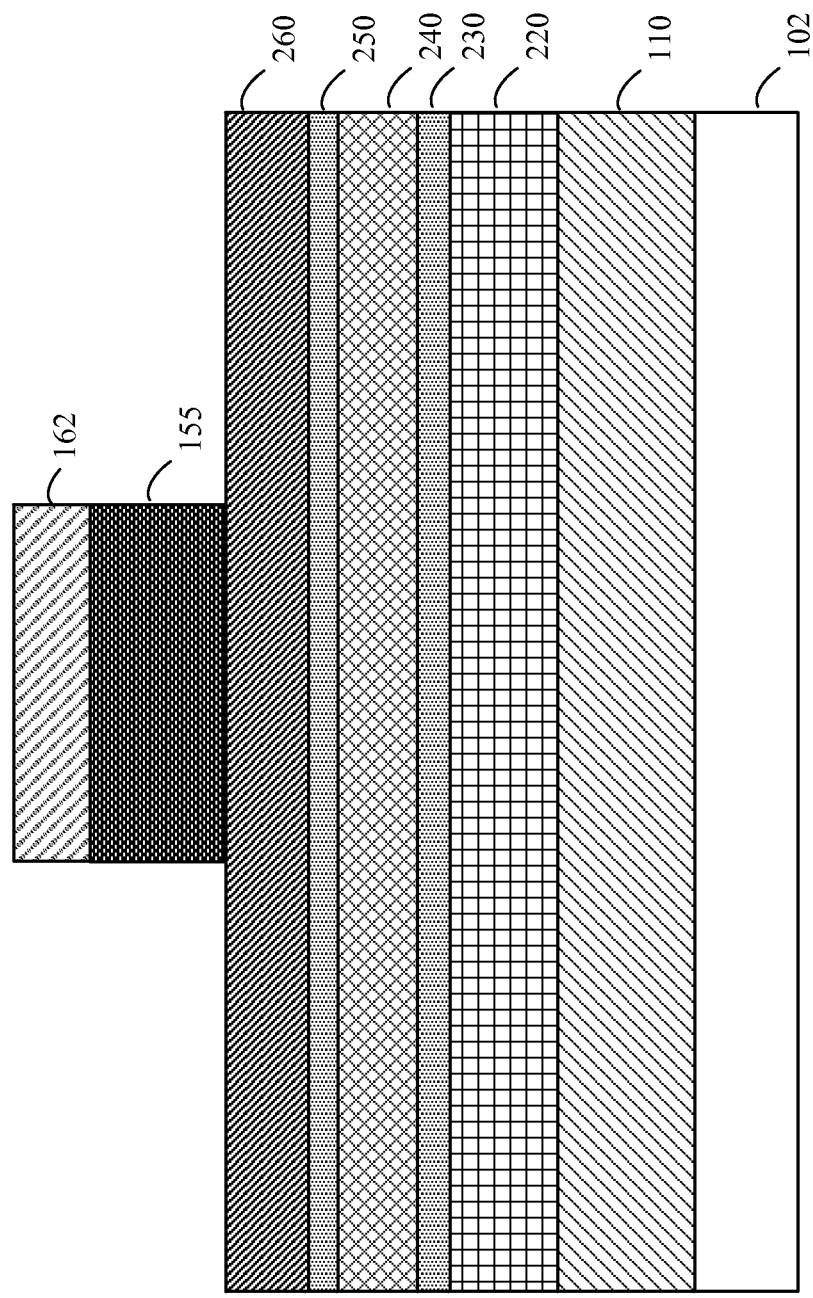

FIG. 17 provides a cross-sectional view of the layers from FIG. 16 following the stripping of the patterned layer of photoresist. As noted above, removing the photoresist prior to etching the layers included in the magnetoresistive device is beneficial as it ensures that subsequent at steps are not contaminated by the photoresist material, which is prone to breakdown and can leave behind undesirable residual material. Because the sidewalls of the top electrode 155 have been exposed by the etching process prior to removal of the photoresist, it is desirable to strip the patterned layer of photoresist using a non-oxidizing gas. Using a non-oxidizing gas to strip the photoresist prevents oxidation or other degradation of the sidewalls of the top electrode 155 and also prevents oxidation or other degradation of the spacer layer 260 prior to etching of that layer. In other embodiments, the photoresist may be stripped at a later point in time, such as during or after etching of one or more of the layers included in that magnetoresistive device stack. In such embodiments, stripping the photoresist using a non-reactive gas is also beneficial in preventing degradation of the sidewalls or other portions of those layers that are exposed when the photoresist is stripped.

By avoiding oxidation or other degradation of the layers within the magnetoresistive device, problems such as higher switching voltages and increased variance in switching voltages across many devices included in a memory or other device are avoided. For example, oxidation may result in a roughness along the sidewalls of the top electrode, where that roughness translates into non-ideal subsequent etching steps corresponding to the layers below the top electrode. In addition to preventing oxidation or degradation of the exposed material in the various layers when photoresist is stripped, using a non-reactive gas to strip the photoresist can also provide beneficial passivation to the exposed layers, thereby helping to avoid degradation of those layers during subsequent etching steps. Moreover, the etching utilized to form the top electrode is typically chemical in nature, and the non-reactive gas (e.g. water vapor) helps to eliminate the corrosive chemistries used during formation of the top electrode prior to the etching steps corresponding to the various layers within the magnetoresistive device stack. Because of the benefits of passivation and elimination of corrosive chemistries, even if the photoresist stripping is performed using something other than a non-oxidizing gas, it can be useful to expose the various layers to water vapor in order to realize those benefits.

In one embodiment, the non-oxidizing gas used strip the photoresist is water vapor ($H_2O$), and the stripping is performed with no cathode bias applied during the stripping process. In other embodiments, other non-reactive gases may be used, where some examples include carbon tetrafluoride ($CF_4$), carbon trifluoride ($CHF_3$), and a mix of water vapor and one or more non-reactive gases.

Figure 18:
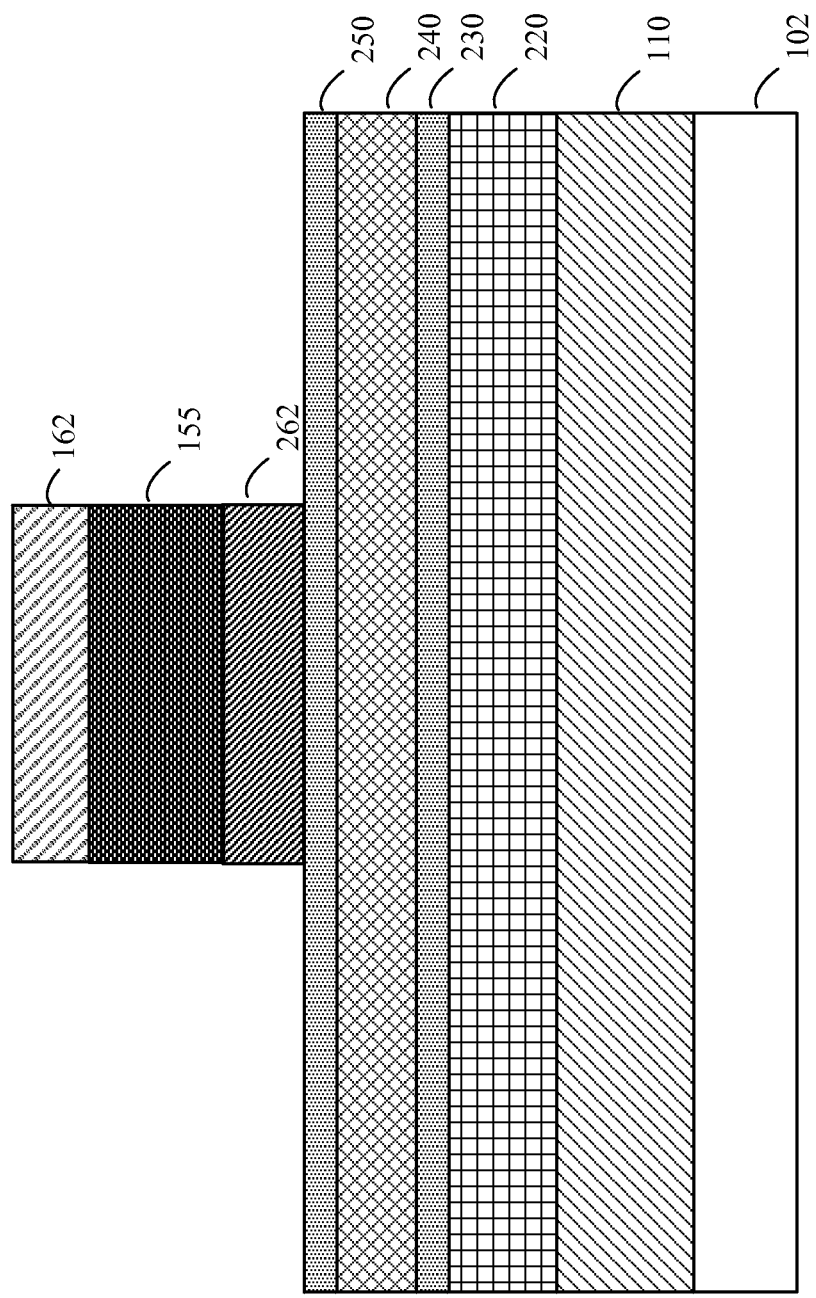

FIG. 18 illustrates a cross-sectional view corresponding to FIG. 17 after the spacer layer 260 has been etched to form etched spacer layer 262. The etched spacer layer 262 acts as a diffusion barrier, and prevents diffusion of the material making up the top electrode 155 from intermingling with or reacting with the dielectric layer 250 underlying the spacer layer. Thus, the spacer layer 262 isolates the underlying dielectric layer from the top electrode. As noted above, while the figures show the photo resist having been removed prior to etching the spacer layer 260, the photoresist can be stripped at different times during the manufacturing process, and, therefore, if such stripping occurs after the spacer layer has been etched, using a non-reactive gas such as water vapor to strip the photoresist will help prevent oxidation or other degradation of the spacer layer.

In some embodiments, the spacer layer includes ruthenium (Ru), which is very reactive with oxygen. As such, using a non-reactive gas to strip the photoresist would prevent oxidation of any exposed portion of the spacer layer. However, following etching of the spacer layer 260, further etching steps corresponding to the underlying dielectric and magnetic layers may also result in oxidation or other degradation of the spacer layer. For example, the dielectric layer 250 and underlying layers may be etched using argon/oxygen etch chemistry (mixtures of Ar and $O_2$) that reacts with ruthenium, causing it to oxidize and expand outwards from the sidewalls forming "veils." As such, utilizing a non-reactive material for the spacer layer that does not reactive to etching materials used is beneficial in that it avoids any oxidation problems corresponding to the various etchings performed in device manufacture. For example, ruthenium dioxide ($RuO_2$), palladium oxide ($PdO_2$), iridium oxide ($ItO_2$), PtMn, IrMn, or other noble metals and alloys that will not oxidize can be used for the spacer layer.

Avoiding the oxidation prevents roughness on the sidewalls of the spacer layer, thereby helping to ensure precise and accurate etching of the layers underlying the spacer layer. If such oxidation is allowed to occur, bulging sidewalls of the spacer layer may result, thereby impacting the underlying etch steps and device functionality. Such irregularities induced by the oxidation can impact MTJ device switching characteristics in a negative manner, for example by increasing the variance in terms of device switching characteristics across the device.

Another technique for avoiding oxidation of the spacer layer is to omit the spacer layer from the device structure. Omitting the spacer layer ensures that any disadvantages caused by roughness on the sidewalls of the spacer layer are avoided.

Figure 19:
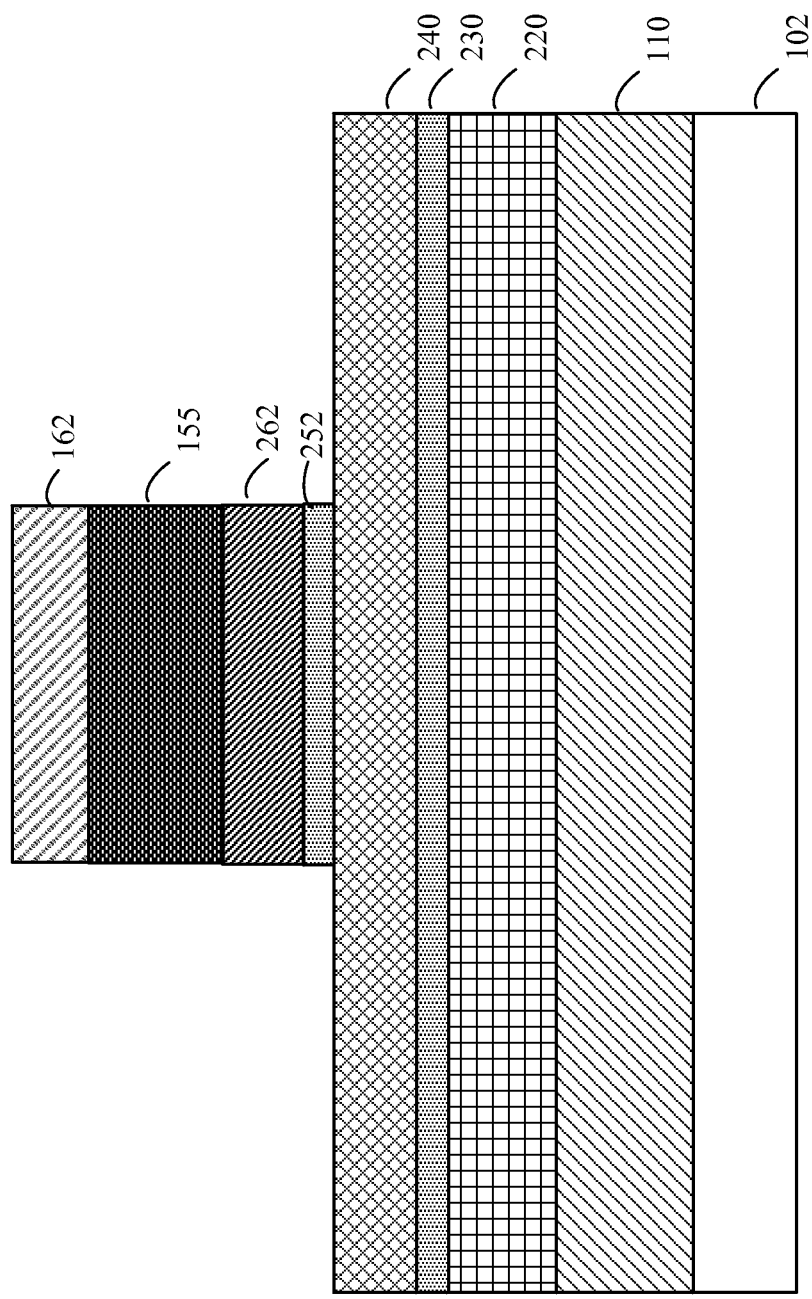

FIG. 19 shows a cross-sectional view corresponding to that of FIG. 18 following etching of the top dielectric layer 250 resulting in etched top dielectric layer 252. The top dielectric layer may serve as a diffusion barrier within the magnetoresistive device. In one embodiment, the top dielectric layer includes magnesium oxide. In some embodiments, in order to protect the spacer layer 262 and top dielectric layer 252 following their etching, encapsulation of the sidewalls of those layers may be performed. Details regarding such encapsulation can be found in U.S. Pat. No. 8,685,756, which is assigned to the same assignee as the present application and is incorporated by reference herein. If the spacer layer and dielectric layer are encapsulated following their definition by etching, subsequent oxidation of those layers is prevented, thereby ensuring the layers remain intact and rough sidewalls do not appear.

Figure 20:
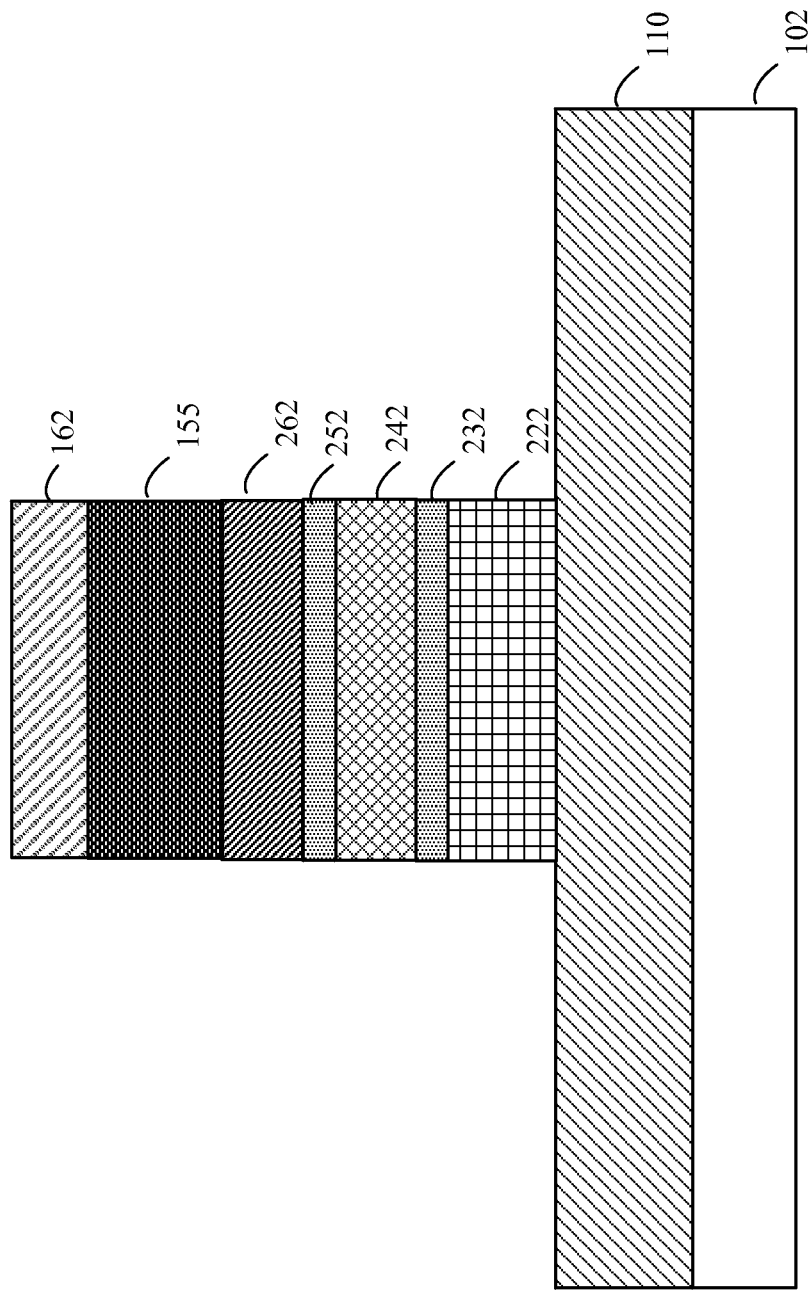

As shown in FIG. 20, following etching of the top dielectric layer 250, the upper magnetic material layer 240 is etched to form layer 242 of the magnetoresistive device stack. As noted above, if the etched sidewalls of the dielectric layer 252 and spacer layer 262 are encapsulated prior to etching the magnetic layer 240, oxidation of the dielectric layer 252 and spacer layer 262 will not occur. As also shown in FIG. 20, the lower dielectric layer 230 is etched to provide etched dielectric layer 232, and the lower magnetic material layer 220 is etched to form etched magnetic material layer 222. After etching, these layers may also be encapsulated in order to protect them during subsequent etching steps, including, for example, etching a lower layer of antiferromagnetic material or etching the lower layer of electrically conductive material 110 to form the bottom electrode. Encapsulation of the etched dielectric layer 232, which may correspond to a tunnel junction for the device, and the etched magnetic material layer 222 is discussed in detail in related pending U.S. patent application Ser. No. 14/296,153 entitled "Isolation of Magnetic Layers During Etch in a Magnetoresistive Device", which is incorporated by reference herein.

Figure 21:
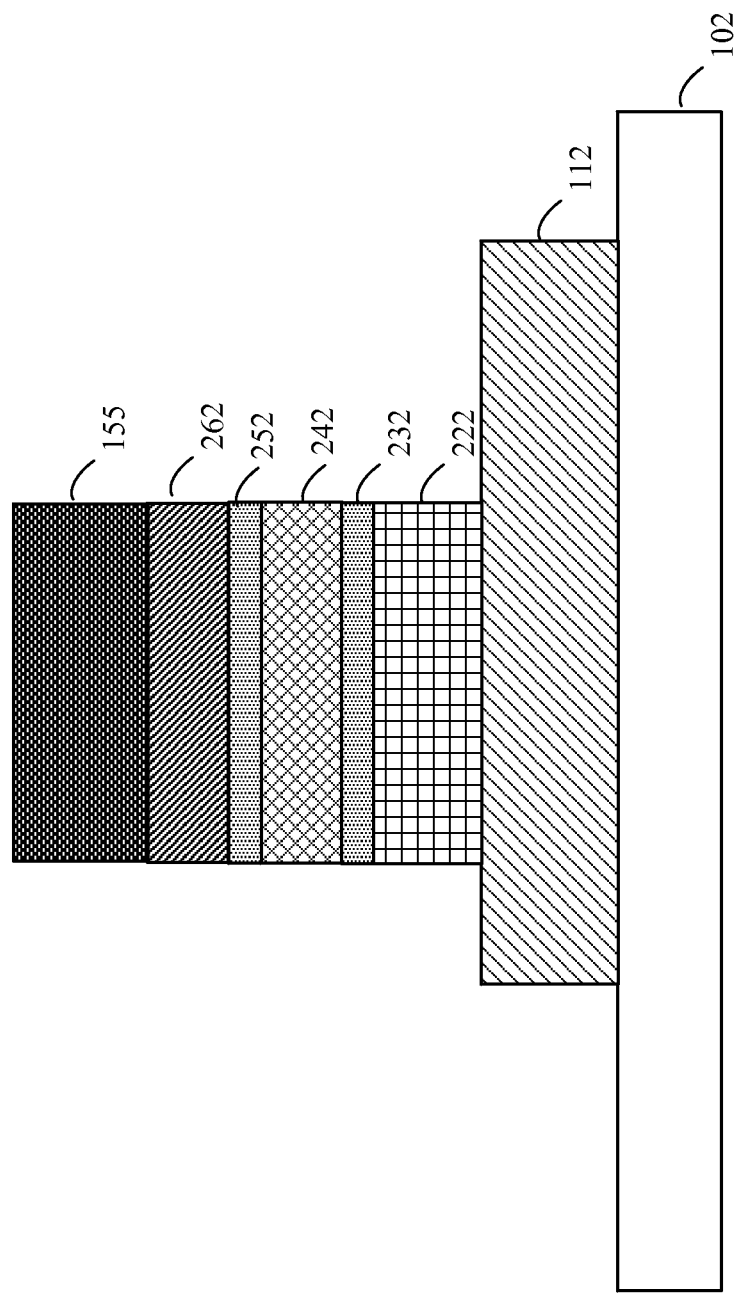

As shown in FIG. 21, following definition of the magnetoresistive device stack, the bottom electrode 112 is formed from the lower level of electrically conductive material 110. The lower electrode 112 provides a means to electrically contact the magnetoresistive device stack. In addition, FIG. 21 shows that the etched hard mask 162 has been removed, thereby providing access to the top electrode 155.

Thus, in magnetoresistive devices that include one or more spacer layers, disadvantages arising from the reactivity of the material in the spacer layers can be avoided by using non-reactive material for the spacer layer in place of reactive material. In other embodiments, spacer layers may be omitted from the device structure. As also described, stripping photoresist using non-reactive gases such as water vapor can be employed for a portion of the manufacturing process, thereby avoiding oxidation of electrode sidewalls and spacer layers that are reactive, while also providing benefits in terms of passivating other exposed surfaces. Moreover, in order to avoid oxidation or other reactions during later etching operations, reactive spacer layers and dielectric layers can be encapsulated, thereby protecting them during those subsequent etching operations.

Figure 22:
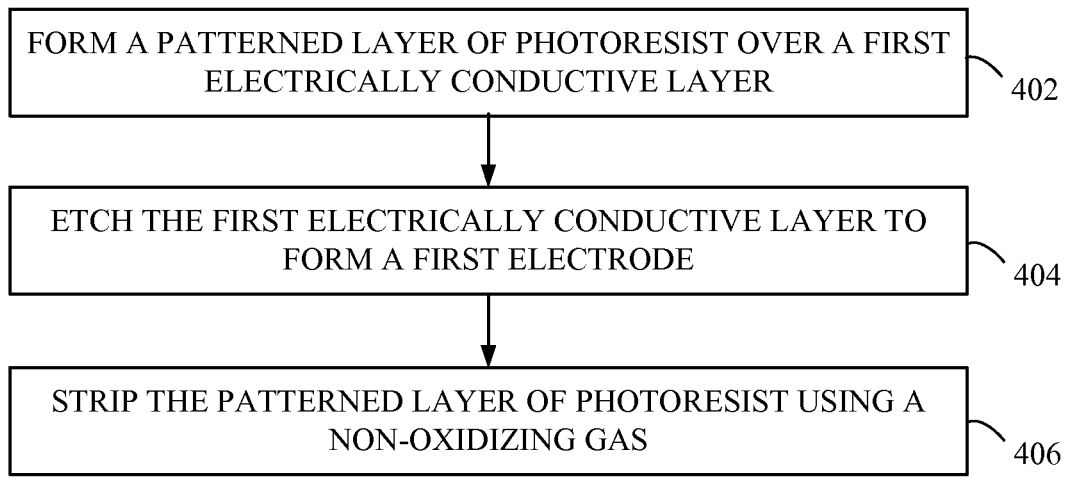
FIGS. 22 and 23 are flow charts of methods of manufacturing a magnetoresistive device in accordance with exemplary embodiments.
Figure 23:
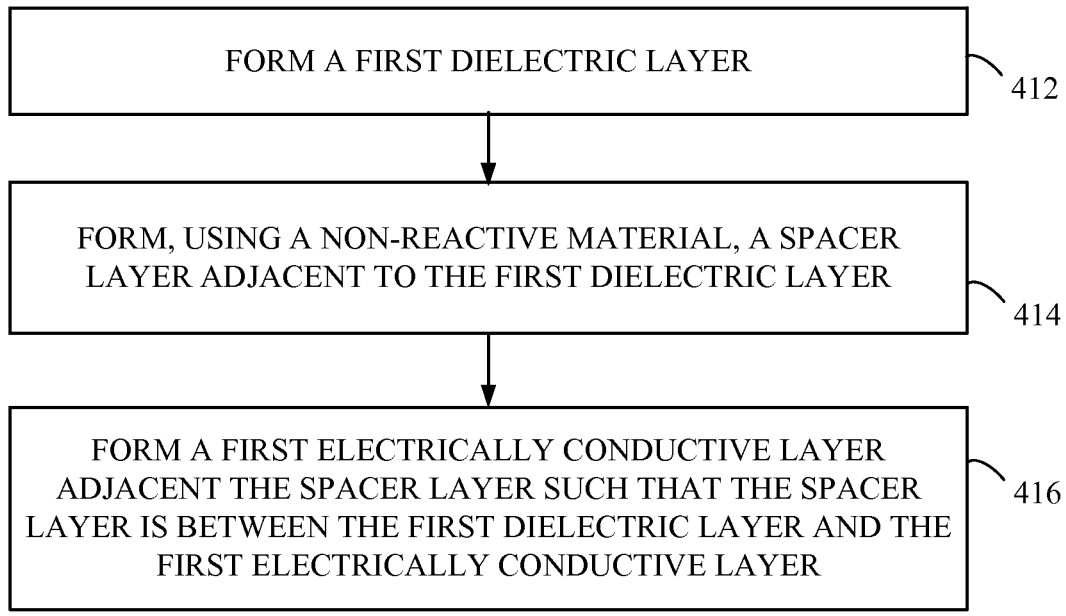

FIGS. 22-24 are flow charts that illustrate exemplary embodiments of a method of manufacturing a magnetoresistive device, where, in one example, the magnetoresistive device is an MTJ device used in an MRAM. The operations included in the flow charts may represent only a portion of the overall process used to manufacture the device. The various tasks performed in connection with methods in FIGS. 22-24 may be performed by software, hardware, firmware, or any combination thereof. For illustrative purposes, the following description of the methods in FIGS. 22-24 may refer to elements mentioned above in connection with FIGS. 1-10 and 15-21. In practice, portions of methods may be performed by different elements of the described system, e.g., a processor, a display element, or a data communication component. It should be appreciated that methods may include any number of additional or alternative tasks, the tasks shown in FIGS. 22-24 need not be performed in the illustrated order, and the methods may be incorporated into a more comprehensive procedure or process having additional functionality not described in detail herein. Moreover, one or more of the tasks shown in FIGS. 22-24 could be omitted from an embodiment as long as the intended overall functionality remains intact.

In FIG. 22 a patterned layer of photoresist is formed at 402 over a first electrically conductive layer. As discussed and illustrated above, a hard mask layer may be included between the patterned layer of photoresist and the electrically conductive layer, thereby providing for a hard mask defined by the patterned layer of photoresist, where the hard mask may be used for subsequent etching steps. At 404 the first electrically conductive layer is etched to form a first electrode. The etching utilized to form the first electrode may include the two-step etching process discussed above, or other conventional or later discovered techniques for forming such an electrode. At 406, the patterned layer photoresist is stripped using a non-oxidizing gas, such as water vapor. By stripping the patterned layer photoresist using a non-oxidizing gas prior to further processing of the underlying layers, the photoresist is removed in a manner that does not result in oxidation of the sidewalls of the first electrode. As noted above, it is desirable to remove the photoresist before physical etching in which bombardment of the wafer occurs, as such physical etching degrades the photoresist in a manner that interferes with the etching process. In addition to eliminating the patterned layer of photoresist, the stripping using water vapor can also provide advantages in terms of passivation and removal of unwanted material left over from chemical etch processes associated with definition of the first electrode.

In FIG. 23 a first dielectric layer is formed at 412. As described and illustrated with respect to FIGS. 15-21, the dielectric layer formed at 412 may correspond to the top dielectric layer 250. At 414, a spacer layer is formed adjacent to the first dielectric layer, where the spacer layer is formed using a non-reactive material. As noted above, by using a non-reactive material for the spacer layer, problems associated with spacer layer reacting to various etch chemistries are avoided. At 416, a first electrically conductive layer is formed adjacent to the spacer layer such that spacer layer is between the first dielectric layer and the first electrically conductive layer. The first electrically conductive layer provides the material later etched to produce the top electrode. Following the formation steps shown in FIG. 23, the etching steps discussed above can occur in order to define the magnetoresistive device structure, where the resulting magnetoresistive device includes a non-reactive spacer layer.

Figure 24A:
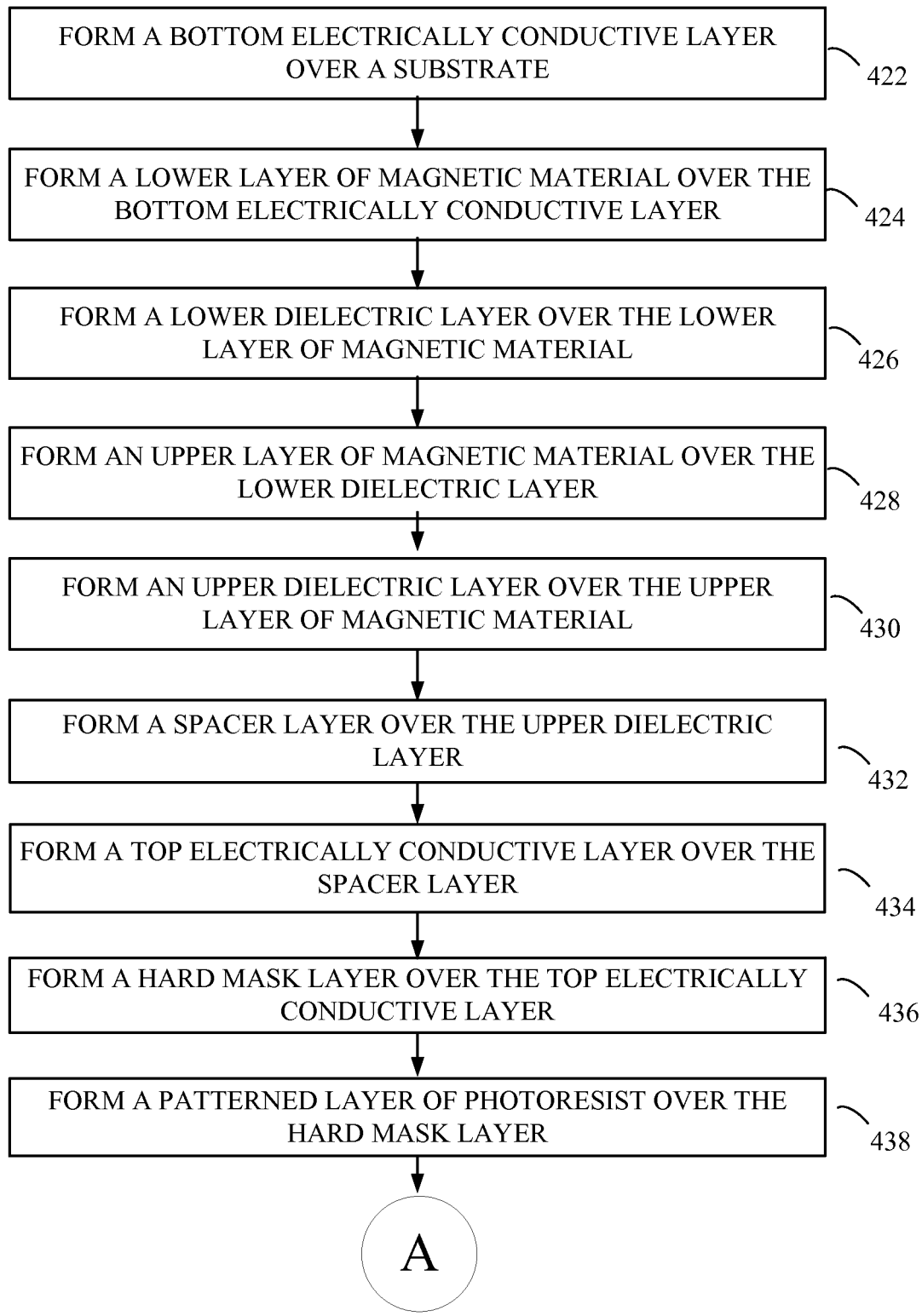
FIGS. 24A and 24B are a flow chart of a method of manufacturing a magnetoresistive device in accordance with another exemplary embodiment.
Figure 24B:
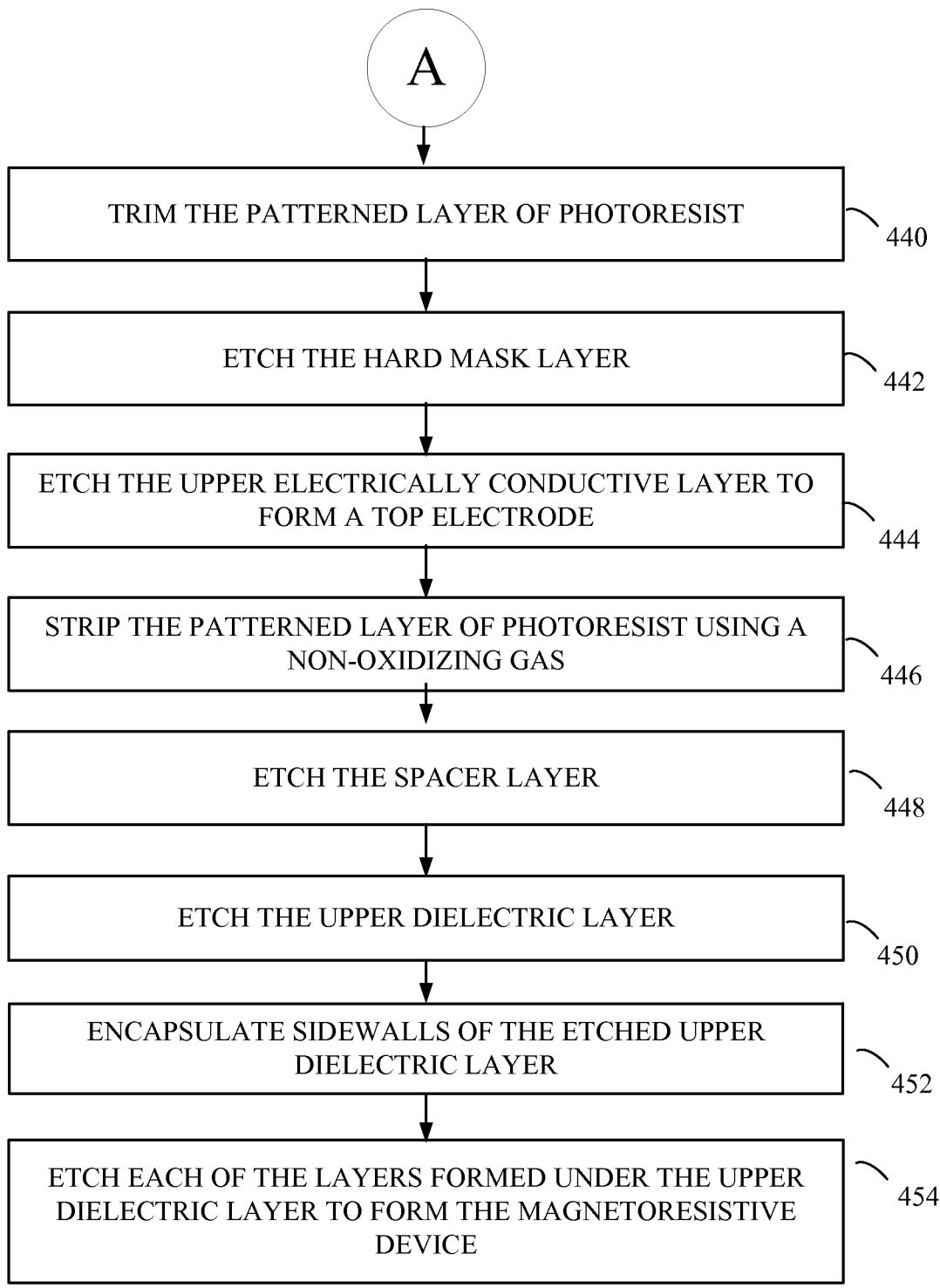

FIG. 24, which includes FIGS. 24A and 24B, provides a flow chart of the formation of the various layers and their subsequent etching in the production of a magnetoresistive device. At 422 a bottom electrically conductive layer is formed over a substrate, where the bottom electrically conductive layer will later be etched in order to form a bottom electrode. At 424 a lower layer of magnetic material is formed over the bottom electrically conductive layer. The lower layer of magnetic material may include a plurality of layers, where one or more of the layers include magnetic material. For example, in one embodiment, the lower layer of magnetic material may include a plurality of layers that form a SAF structure following subsequent processing steps. At 426 a lower dielectric layer is formed over the lower layer of magnetic material. The lower dielectric layer may serve as a tunnel junction in an MTJ device.

At 428 an upper layer of magnetic material is formed over the lower dielectric layer. As was the case with the lower layer of magnetic material, the upper layer of magnetic material may include a plurality of sub-layers, where some of the sub-layers are magnetic materials, whereas others may be coupling layers that force certain interactions between the layers of magnetic material. For example, the upper layer of magnetic material may include layers that, after subsequent processing, result in a SYF structure. At 430, and upper dielectric layer is formed over the upper layer of magnetic material. In one embodiment, the upper dielectric layer serves as a diffusion barrier. At 432, a spacer layer is formed over the upper dielectric layer. As discussed above, the spacer layer may prevent diffusion between the top electrode of the device and the upper dielectric layer. As also discussed above, the spacer layer may be formed of a non-reactive material in order to avoid undesirable rough edges of the spacer layer resulting from reactions during subsequent etching operations. In other embodiments, the spacer layer may be omitted from the device structure.

At 434 a top electrically conductive layer is formed over the spacer layer. The top electrically conductive layer provides the material used to define the top electrode for the device. At 436, a hard mask layer is formed over the top electrically conductive layer. At 438, a patterned layer of photoresist is formed over the hard mask layer. At 440, the patterned layer of photoresist is trimmed in order to reduce the feature size of the photoresist. As noted above, such trimming enables finer resolution than may be achieved using available lithographic techniques. At 442 the hard mask layer is etched to define a hard mask. At 444 the upper electrode layer not covered by the hard mask layer is etched to form the top electrode.

At 446 the patterned layer of photoresist is stripped using a non-oxidizing gas such as water vapor. As noted above, stripping the photoresist may occur immediately after definition of the top electrode, or at other times during the wafer processing operations corresponding to manufacture of the magnetoresistive device. For example, some or all of the spacer layer may be etched prior to stripping the patterned layer of photoresist. At 448 the spacer layer is etched. At 450 the upper dielectric layer is etched, thereby exposing the sidewalls of the upper dielectric layer and rendering them vulnerable to oxidation or other undesirable reactive chemistries. In order to avoid such oxidation, at 452 the sidewalls of the etched upper dielectric layer are encapsulated. Encapsulation prevents oxidation or other undesirable reactions from occurring to the sidewalls of the upper dielectric layer. As noted above, the encapsulation performed at 452 may also include encapsulation of the sidewalls of the spacer layer.

At 454 each of the layers formed under the upper dielectric layer is etched to form the magnetoresistive device. Thus, one or multiple etching operations corresponding to the various underlying layers occur in order to define the magnetoresistive device stack and bottom electrode. By minimizing undesirable degradation of sidewalls included in the magnetoresistive device structure, the precision with which the devices can be made is improved, thereby risk reducing the variance of switching characteristics or other MTJ parameters across the die, which may correspond to an MRAM device.

Although the described exemplary embodiments disclosed herein are directed to various magnetoresistive-based devices and methods for making same, the present disclosure is not necessarily limited to the exemplary embodiments, which illustrate inventive aspects that are applicable to a wide variety of semiconductor processes and/or devices. Thus, the particular embodiments disclosed above are illustrative only and should not be taken as limitations, as the embodiments may be modified and practiced in different but equivalent manners apparent to those skilled in the art having the benefit of the teachings herein. Accordingly, the foregoing description is not intended to limit the disclosure to the particular form set forth, but on the contrary, is intended to cover such alternatives, modifications and equivalents as may be included within the spirit and scope of the inventions as defined by the appended claims so that those skilled in the art should understand that they can make various changes, substitutions and alterations without departing from the spirit and scope of the inventions in their broadest form.

What is claimed is:

1. A method of forming a magnetoresistive device, comprising:
    forming a spacer layer over a dielectric layer;
    forming a first electrically conductive layer over the spacer layer, wherein after the first electrically conductive layer is formed, the spacer layer is between the first electrically conductive layer and the dielectric layer;
    forming a patterned layer of photoresist over the first electrically conductive layer;
    etching the first electrically conductive layer not covered by the patterned layer of photoresist to form a first electrode;
    stripping the patterned layer of photoresist using a non-oxidizing gas; and
    after stripping the patterned layer of photoresist and etching the first electrically conductive layer, etching the dielectric layer not covered by the first electrode to form an etched dielectric layer.

2. The method of claim 1, further comprising etching a first magnetic material layer not covered by the first electrode, wherein the first magnetic material layer is under the dielectric layer.

3. The method of claim 2, further comprising:
    after etching the dielectric layer, encapsulating sidewalls of the etched dielectric layer prior to etching the first magnetic material layer.

4. The method of claim 1, further comprising:
    after stripping the patterned layer of photoresist, passivating at least the first electrode using water vapor.

5. The method of claim 1, wherein stripping the patterned layer of photoresist is done after etching the first electrically conductive layer.

6. The method of claim 1, wherein stripping the patterned layer of photoresist includes stripping at least a portion of the patterned layer of photoresist using water vapor.

7. The method of claim 1, wherein stripping the patterned layer of photoresist includes stripping at least a portion of the patterned layer of photoresist using one of carbon tetrafluoride ($CF_4$) and carbon trifluoride ($CHF_3$).

8. The method of claim 1, wherein stripping the patterned layer of photoresist further comprises stripping the patterned layer of photoresist using a non-oxidizing gas consisting of water vapor.

9. The method of claim 1, wherein forming the spacer layer further comprises forming the spacer layer using at least one of ruthenium dioxide ($RuO_2$), palladium oxide ($PdO_2$), iridium oxide ($IrO_2$), platinum manganese (PtMn), and iridium manganese (IrMn).

10. A method of forming a magnetoresistive device, comprising:
    forming a patterned layer of photoresist over a first electrically conductive layer;
    etching the first electrically conductive layer not covered by the patterned layer of photoresist to form a first electrode;
    stripping the patterned layer of photoresist using a non-oxidizing gas;
    prior to forming the patterned layer of photoresist:
        forming a second electrically conductive layer over a substrate;
        forming a lower layer of magnetic material over the second electrically conductive layer;
        forming a lower dielectric layer over the lower layer of magnetic material;
        forming an upper layer of magnetic material over the lower dielectric layer;
        forming an upper dielectric layer over the upper layer of magnetic material;
        forming a spacer layer over the upper dielectric layer;
        forming the first electrically conductive layer over the spacer layer; and
        forming a hard mask layer over the first electrically conductive layer, wherein the patterned layer of photoresist is formed over the hard mask layer;
    after forming the patterned layer of photoresist and prior to etching the first electrically conductive layer, etching the hard mask layer not covered by the patterned layer of photoresist; and
    after stripping the patterned layer of photoresist and etching the first electrically conductive layer, etching each layer formed under the first electrically conductive layer to form the magnetoresistive device.

11. The method of claim 10, wherein forming the spacer layer further comprises forming the spacer layer using a non-reactive material that does not react to materials used in etching each of the layers formed under the spacer layer.

12. The method of claim 10, wherein at least one of the first electrically conductive layer, the second electrically conductive layer, the lower layer of magnetic material, the lower dielectric layer, the upper layer of magnetic material, the upper dielectric layer, the spacer layer, and the hard mask layer is a composite layer that includes a plurality of sub-layers.

13. A method of forming a magnetoresistive device, comprising:
    forming a first dielectric layer;
    forming a spacer layer on the first dielectric layer, the spacer layer formed using a non-reactive material that does not react to etching materials used in etching layers after selective etching of the spacer layer; and
    forming a first electrically conductive layer on the spacer layer such that the spacer layer is between the first dielectric layer and the first electrically conductive layer.

14. The method of claim 13, further comprising:
    forming a hard mask layer over the first dielectric layer, the spacer layer, and the first electrically conductive layer;
    forming a patterned photoresist layer over the hard mask layer;
    etching the hard mask layer not covered by the patterned photoresist layer to form a hard mask;
    etching at least one of the first dielectric layer, the spacer layer, and the first electrically conductive layer not covered by the hard mask layer; and
    stripping the patterned photoresist layer using a non-reactive gas.

15. The method of claim 14, wherein stripping the patterned photoresist further comprises stripping the patterned photoresist using water vapor.

16. The method of claim 13 further comprises:
selectively etching the first dielectric layer to produce an etched first dielectric layer; and
encapsulating sidewalls of the etched first dielectric layer.

17. The method of claim 13 further comprising:
forming a second electrically conductive layer over a substrate;
forming a lower layer of magnetic material over the second electrically conductive layer;
forming a lower dielectric layer over the lower layer of magnetic material; and
forming an upper layer of magnetic material over the lower dielectric layer, wherein the first dielectric layer is formed over the upper layer of magnetic material.

18. A method of forming a magnetoresistive device, comprising:
forming a first electrically conductive layer over a substrate;
forming a lower layer of magnetic material over the first electrically conductive layer;
forming a lower dielectric layer over the lower layer of magnetic material;
forming an upper layer of magnetic material over the lower dielectric layer;
forming an upper dielectric layer over the upper layer of magnetic material;
forming a spacer layer on the upper dielectric layer, the spacer layer formed using a non-reactive material that does not react to etching materials used in etching at least one of the first electrically conductive layer, the lower layer of magnetic material, the lower dielectric layer, the upper layer of magnetic material, and the upper dielectric layer;
forming a second electrically conductive layer on the spacer layer such that the spacer layer is between the upper dielectric layer and the second electrically conductive layer;
forming a patterned layer of photoresist over the second electrically conductive layer; and
stripping the patterned layer of photoresist using a non-oxidizing gas.

19. The method of claim 18, wherein stripping the patterned layer of photoresist further comprises stripping the patterned layer of photoresist using a non-oxidizing gas consisting of water vapor.

20. The method of claim 19, wherein forming the spacer layer further comprises forming the spacer layer using at least one of ruthenium dioxide ($RuO_2$), palladium oxide ($PdO_2$), iridium oxide ($IrO_2$), platinum manganese (PtMn), and iridium manganese (IrMn).

* * * * *